(12) United States Patent
Spence et al.

(10) Patent No.: US 9,899,559 B2
(45) Date of Patent: Feb. 20, 2018

(54) SYSTEM AND METHOD FOR PRODUCING MODULAR PHOTOVOLTAIC PANEL ASSEMBLIES FOR SPACE SOLAR ARRAYS

(71) Applicant: Deployable Space Systems, Inc., Santa Barbara, CA (US)

(72) Inventors: Brian J Spence, Solvang, CA (US); Stephen F White, Ventura, CA (US); Tiffany N Allmandinger, Goleta, CA (US); Paul Cronin, Oxnard, CA (US)

( * ) Notice: Subject to any disclaimer, the term of this patent is extended or adjusted under 35 U.S.C. 154(b) by 3 days.

(21) Appl. No.: 15/231,542

(22) Filed: Aug. 8, 2016

(65) Prior Publication Data
US 2016/0351746 A1    Dec. 1, 2016

Related U.S. Application Data

(62) Division of application No. 14/702,704, filed on May 2, 2015, now Pat. No. 9,444,004.
(Continued)

(51) Int. Cl.
*B23K 31/02* (2006.01)
*H01L 31/18* (2006.01)
(Continued)

(52) U.S. Cl.
CPC ........... *H01L 31/18* (2013.01); *B23K 9/00* (2013.01); *H01L 31/041* (2014.12);
(Continued)

(58) Field of Classification Search
CPC ..... H01L 31/18; H01L 31/041; H01L 31/188; Y02P 70/521; Y02E 10/50
See application file for complete search history.

(56) References Cited

U.S. PATENT DOCUMENTS 5,507,085 A * 4/1996 Easton ............... B23P 19/04
29/407.01
5,922,168 A * 7/1999 Zablotny ............ H01G 4/308
156/361
(Continued)

FOREIGN PATENT DOCUMENTS

DE    3238187 A1 * 4/1984 ......... H01L 31/1876
WO    WO 2010146607 A2 * 12/2010 ........ H01L 31/048

*Primary Examiner* — Kiley Stoner
(74) *Attorney, Agent, or Firm* — R. Scott Kimsey, Esq.; Klein DeNatale Goldner

(57) ABSTRACT

An automated system provides automated manufacturing of photovoltaic standard power modules for utilization in a space solar array, in both rolled blanket and z-folded configurations. The automated system provides robotically controlled systems for CIC-ing, glassing, stringing, laydown and acceptance testing of interconnected photovoltaic devices. A method of manufacturing the photovoltaic standard power modules includes the steps of robotic positioning of diodes, interconnects and busbars onto a SPM stringing tray followed by the robotic positioning of bare cells into position adjacent to the diodes, interconnects and busbars to form strings. The SPM stringing tray is thereafter robotically positioned adjacent to an integral welder for welding of the front side of the string. Cover glass is thereafter robotically placed over the cells. The string is flipped and the backside of the string is robotically positioned for welding.

3 Claims, 32 Drawing Sheets

Related U.S. Application Data

(60) Provisional application No. 61/988,102, filed on May 2, 2014.

(51) Int. Cl.
  *B23K 9/00* (2006.01)
  *H01L 31/041* (2014.01)
  *B23K 101/36* (2006.01)

(52) U.S. Cl.
  CPC ........ *H01L 31/188* (2013.01); *B23K 2201/36* (2013.01); *Y02E 10/50* (2013.01); *Y02P 70/521* (2015.11)

(56) References Cited

U.S. PATENT DOCUMENTS

| | | | | |
|---|---|---|---|---|
| 6,103,970 | A * | 8/2000 | Kilmer | H01L 31/1852 136/252 |
| 8,636,198 | B1 * | 1/2014 | Linderman | H01L 24/34 228/164 |
| 2003/0092363 | A1 * | 5/2003 | Laursen | B24B 37/26 451/41 |
| 2003/0202092 | A1 * | 10/2003 | Sadighi | B25J 9/1692 348/87 |
| 2004/0058067 | A1 * | 3/2004 | Law | C23C 18/1605 427/240 |
| 2005/0217718 | A1 * | 10/2005 | Dings | H01L 31/188 136/256 |
| 2006/0269384 | A1 * | 11/2006 | Kiaie | B25J 9/0096 414/222.02 |
| 2006/0272987 | A1 * | 12/2006 | Jung | H01L 21/67236 209/538 |
| 2007/0264104 | A1 * | 11/2007 | Hosaka | H01L 21/67265 414/186 |
| 2007/0283997 | A1 * | 12/2007 | Hachtmann | H01L 31/03928 136/244 |
| 2008/0179301 | A1 * | 7/2008 | Garty | C40B 30/10 219/121.69 |
| 2008/0188162 | A1 * | 8/2008 | Kobata | B23H 5/08 451/8 |
| 2008/0220955 | A1 * | 9/2008 | Hesse | B23K 37/02 483/14 |
| 2009/0139557 | A1 * | 6/2009 | Rose | H01L 31/18 136/244 |
| 2009/0145478 | A1 * | 6/2009 | Takahashi | C08J 7/045 136/256 |
| 2009/0249606 | A1 * | 10/2009 | Diez | B23K 11/11 29/428 |
| 2010/0325889 | A1 * | 12/2010 | Buttress | B23K 9/0286 29/890.033 |
| 2011/0073580 | A1 * | 3/2011 | Ma | B23K 9/123 219/137 R |
| 2011/0147437 | A1 * | 6/2011 | Eusch | B23K 1/0008 228/44.7 |
| 2011/0284052 | A1 * | 11/2011 | Croft | H01L 31/042 136/244 |
| 2012/0013897 | A1 * | 1/2012 | Lai | H01L 31/188 356/237.1 |
| 2012/0040488 | A1 * | 2/2012 | Walker | H01L 31/022425 438/67 |
| 2012/0080507 | A1 * | 4/2012 | Luechinger | B23K 20/10 228/110.1 |
| 2012/0085812 | A1 * | 4/2012 | Luechinger | B23K 20/10 228/110.1 |
| 2012/0244702 | A1 * | 9/2012 | Baccini | H01L 31/02245 438/667 |
| 2013/0065353 | A1 * | 3/2013 | Albrecht | B32B 17/10036 438/73 |
| 2013/0071218 | A1 * | 3/2013 | Hosek | H01L 21/67259 414/744.5 |
| 2013/0095578 | A1 * | 4/2013 | Baccini | H01L 31/18 438/14 |
| 2013/0112735 | A1 * | 5/2013 | Luechinger | H01L 31/0504 228/110.1 |
| 2013/0139376 | A1 * | 6/2013 | De Salins | H01L 31/18 29/592.1 |
| 2013/0237000 | A1 * | 9/2013 | Tabe | H01L 31/18 438/57 |
| 2013/0272833 | A1 * | 10/2013 | Duncan | H01L 31/188 414/737 |
| 2013/0312807 | A1 * | 11/2013 | Tseng | H01L 31/0504 136/244 |
| 2014/0076382 | A1 * | 3/2014 | Dafniotis | H01L 31/0516 136/251 |
| 2015/0076214 | A1 * | 3/2015 | Kodama | H01L 31/188 228/101 |
| 2015/0239067 | A1 * | 8/2015 | Bricker | B23K 9/02 228/105 |
| 2015/0287857 | A1 * | 10/2015 | Spotti | H01L 31/048 438/67 |
| 2015/0303089 | A1 * | 10/2015 | Doherty | H01L 21/67259 414/222.07 |
| 2015/0372642 | A1 * | 12/2015 | Spotti | H01L 31/188 29/730 |
| 2016/0027933 | A1 * | 1/2016 | Lu | B23K 1/012 228/180.21 |
| 2016/0056032 | A1 * | 2/2016 | Baldasseroni | H01L 21/0228 438/778 |
| 2016/0111574 | A1 * | 4/2016 | Yoshimine | H01L 31/0508 136/244 |
| 2016/0196997 | A1 * | 7/2016 | White | H01L 21/67718 361/234 |
| 2016/0268463 | A1 * | 9/2016 | Richards | H01L 31/048 |

* cited by examiner

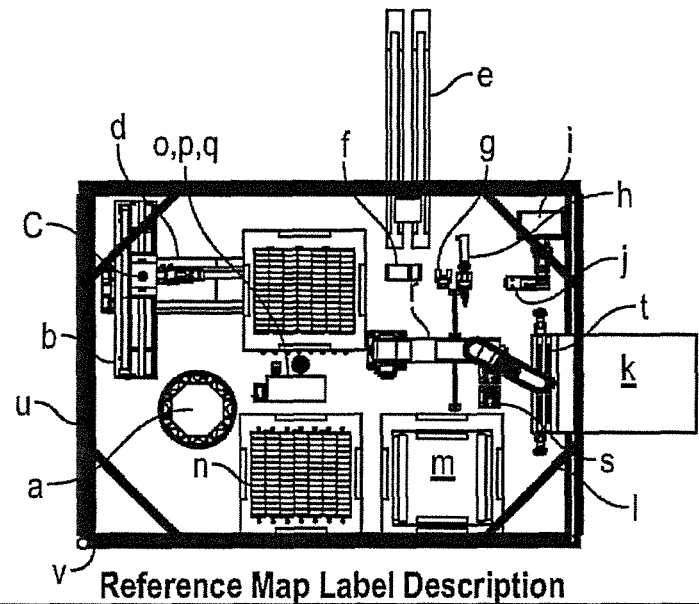

Reference Map Label Description

| Label | Description |
|---|---|
| a | Carousel |
| b | X Stage linear Motor |
| c | SPM Weld Head |
| d | Y Stage linear Motor |
| e | Reel Feeders |
| f | Bus-Bar and Turn-Around Stand |
| g | Cell Flipper |
| h | Weld Push Test Stand |
| i | Single Cell Weld Head |
| j | Single Cell Liner Motor |
| k | Gravity Fed Weight Strip Ramp |
| l | W3eight Strip Escapement Assembly |
| m | Kapton Flim Tray |
| n | SPM Stringing/clcING Tray |
| o | Cell Resistance Test Stand |
| p | Bar Code Scanner |
| q | Red LED Ring Light and Lens |
| r | Scara Robot |
| s | End Effector Tools |
| t | Weight Strips |
| u | Enclosure |
| v | Patlite |

FIG. 29

SYSTEM AND METHOD FOR PRODUCING MODULAR PHOTOVOLTAIC PANEL ASSEMBLIES FOR SPACE SOLAR ARRAYS

RELATED APPLICATIONS

This is a divisional application of U.S. application Ser. No. 14/702,704 which claims priority to Provisional Patent Application No. 61/988,102 filed on May 2, 2014.

BACKGROUND OF THE INVENTION

The present invention relates to photovoltaic arrays and methods of manufacturing photovoltaic arrays. More particularly, the present invention relates to a method and a system for the manufacture of power modules for solar arrays that require less time and labor than required for presently known methods and systems. Various space craft and man-made satellites utilize photovoltaic ("PV") arrays for recharging of batteries and/or operation of various systems. The PV arrays are a collection of solar cells formed into a unit referred to as a "CIC" (solar cell—interconnect—coverglass). The completed CICs are assembled into strings which are configured into standard power modules (SPMs). The SPMs include interconnected solar cell assemblies, frontside and rearside shielding/coatings, substrate structure, mechanical attachment interfaces, and electrical interconnection interfaces. A number of SPMs are thereafter mechanically and electrically connected to create various blanket architecture aspect ratios, allowing for seamless adaptability to a variety of flexible blanket solar array systems. SPMs manufactured with the disclosed system and according to the disclosed method may be utilized as building blocks to form an Integrated Modular Blanket Assembly ("IMBA").

U.S. Pat. No. 6,555,739 by Kawam describes a known method of manufacturing a photovoltaic array. According to this method, a CIC is formed by welding or soldering one or more interconnect members (made of a thin ribbon of silver or similar metal) to the solar cell's top surface metal layer. Thereafter, a liquid, translucent silicone adhesive is applied to the solar cell's top surface to bond a layer of doped glass to the cell and interconnect. After all of the solar cells have been formed into CICs, the CICs are assembled into strings. As further described by Kawam, as part of this assembly process, all of the CICs are placed, one at a time, on an alignment tool or jig, with their glass sides down, interleaving the CICs such that the interconnect member from one CIC is resting on the bottom side of an adjacent CIC. The interconnect members are then attached to the bottom side of adjacent CICs by a soldering and/or a welding process. After a desired number of CICs have been so arranged and attached to form a string, the string is transferred to a substrate, which embodies the final solar array configuration. This transfer process is accomplished by first attaching masking tape or similar non-permanent adhesive to the backside of the string, and transporting the taped string, glass side down, onto a transfer device that is fabricated from a sheet of mylar. The transfer device, fabricated from mylar or similar material, allows the array of modules to be handled and lifted into position.

As the next step, the surface of the substrate to be laminated with the string of solar cells is primed by painting a silane material on the substrate surface. As noted by Kawam, the backsides of each of the solar cells are also primed with this material to promote subsequent silicone adhesion. A thin layer of liquid silicone adhesive is then applied to the primed substrate. While the adhesive is still wet and uncured, the string is quickly set into place atop the adhesive applied to the substrate. The string is aligned and individual weights applied to the cells while the adhesive cures, which may take up to a week. After curing, excess adhesive is removed from the PV array.

Kawam notes that the above process was developed in an effort to create a batch process. As noted, first the CICs are assembled, then strings are assembled, and then the strings are transferred to substrates to form the PV arrays. Kawaam notes this manufacturing process involves the handling of the solar cells during at least four separate operations, which results in excessive cost and cycle time. He further notes that the process permits only portions of the assembly to be automated and that this process results in damage to 5% to 8% of the solar cells.

Kawam directs his attention the need to eliminating the need to solder or weld the interconnects to the solar cells, where his solution is to construct strings by bonding the solar cells and interconnect members to the array surface of a substrate with double-sided and pressure sensitive adhesive, and electrically coupling the interconnect members and end members to the solar cells via a dry electrical contact. However, Kawam does not disclose any automated device for the assembly of the strings he discloses. He specifically teaches against a single automated method which produces strings with welded interconnects.

Thus, while there have been some efforts to automate the process, there is not a known system or method which provides for the assembly of an SPM suitable for a space solar array by a single automated device.

SUMMARY OF THE INVENTION

The present invention provides an automated manufacturing system and method for CIC-ing, glassing, stringing, laydown and acceptance testing of interconnected photovoltaic devices to assemble photovoltaic standard power modules for assembly onto an ultra-lightweight photovoltaic flexible blanket (IMBA) for utilization in a space solar array, in both rolled blanket and z-folded configurations. The automated manufacturing system disclosed herein provides high performance and repeatable high quality photovoltaic panels/modules at a cost which is significantly lower than the known devices.

The system comprises the following subassemblies: (1) end effector tools consisting of: SPM tray carrier, adhesive dispenser, preload bar pickup and cell/interconnect vacuum chuck tools; (2) enclosure assembly; (3) adhesive system assembly; (4) carousel system assembly; (5) gravity feed system assembly; (6) preload stabilizer assembly for glass bonding; (7) SPM assembly tray; (8) SPM/Kapton substrate bonding tray; (9) vacuum manifold interface tray assembly; (10) interconnect liner weld assembly; (11) cell interconnect reel feeder assembly; (12) diode interconnect reel feeder assembly; (13) SCARA robotic system; (14) integrated circuit inverter/flipper assembly; (15) cell or integrated string flipper assembly; (16) X-Y-Z welding assembly stage; (17) vision and sensor system assembly; and (18) interconnect weld strength test stand assembly.

A method of manufacturing power modules for solar arrays generally comprises the following steps: (1) robotic positioning of diodes, interconnects and busbars onto a SPM stringing tray; (2) robotic positioning of bare cells into position adjacent to the diodes, interconnects and busbars to form strings; (3) robotic positioning of the front side of the string adjacent to an integral welder and welding the front side of the string; (4) robotic placement of cover glass over the cells; (5) robotic positioning of a weight assembly on the cover glass to apply a load to maintain the coverglass bond line; (6) flipping the string; (7) robotic positioning of the string adjacent to the integral welder and welding the back side of the string; (8) robotic placement of a kapton substrate over the string. Embodiments of the method include: (a) a method of utilizing prefabricated CICs in the fabrication of SPMs; (b) a method of utilizing bare cells in the fabrication of SPMS; (c) a method of utilizing inverted metamorphic multi-junction ("IMM") cells in the fabrication of SPMS.

BRIEF DESCRIPTION OF THE DRAWINGS

FIG. 1 depicts an embodiment of the SCARA robotic system selecting a tool from the end erector tools.

FIGS. 2-3 depict the robotic system of FIG. 1 selecting a SPM tray carrier tool.

FIGS. 3-4 depict the carrier gripping tool picking up a SPM assembly tray.

FIG. 5 depicts the SPM assembly tray being loaded onto an X axis linear motor.

FIG. 6 depicts the robotic system of FIG. 1 exchanging the SPM carrier tool for a vacuum assisted pickup mechanism.

FIGS. 7-8 depicts the vacuum assisted pickup mechanism in position to pick up diodes, interconnects and busbars from respective reel feeder assemblies for each component for placement on the SPM assembly tray.

FIGS. 9-10 depicts diodes, interconnects and busbars as positioned on the SPM assembly tray by the vacuum assisted pickup mechanism.

FIGS. 11-14 depict bare cells being picked up from a carousel assembly, and placement of the bare cells on the SPM assembly tray.

FIG. 15 depicts the welder welding the interconnects on the front side of the string.

FIG. 16 depicts the robotic positioning of an adhesive dispenser for dispensing adhesive onto the cells in preparation of placement of cover glass.

FIGS. 17-20 depict cover glass member being picked up from the carousel assembly and placed on each cell.

FIGS. 21-23 depict the robotic positioning of calibrated weights over the coverglass.

FIG. 24 depicts the external reorientation of the string.

FIG. 25 depicts the welding of the backside interconnects.

FIG. 26 depicts the application of the kapton substrate.

FIG. 27 depicts a competed SPM.

FIG. 29 shows a plan view of the manufacturing system depicted in FIG. 28.

DETAILED DESCRIPTION OF THE EMBODIMENTS

Figure 1:
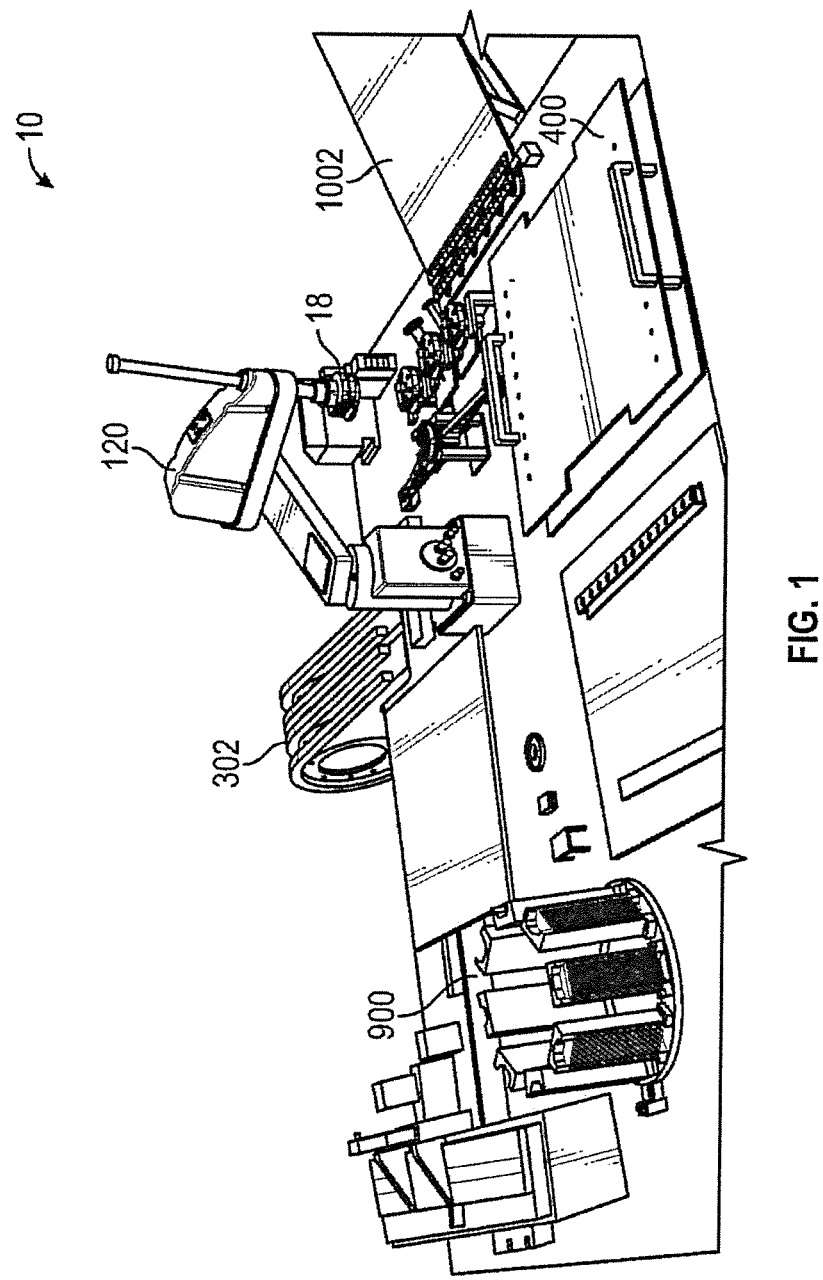
FIGS. 1-27 depict an embodiment of the manufacturing system in the process of fabricating an SPM, specifically.
Figure 2:
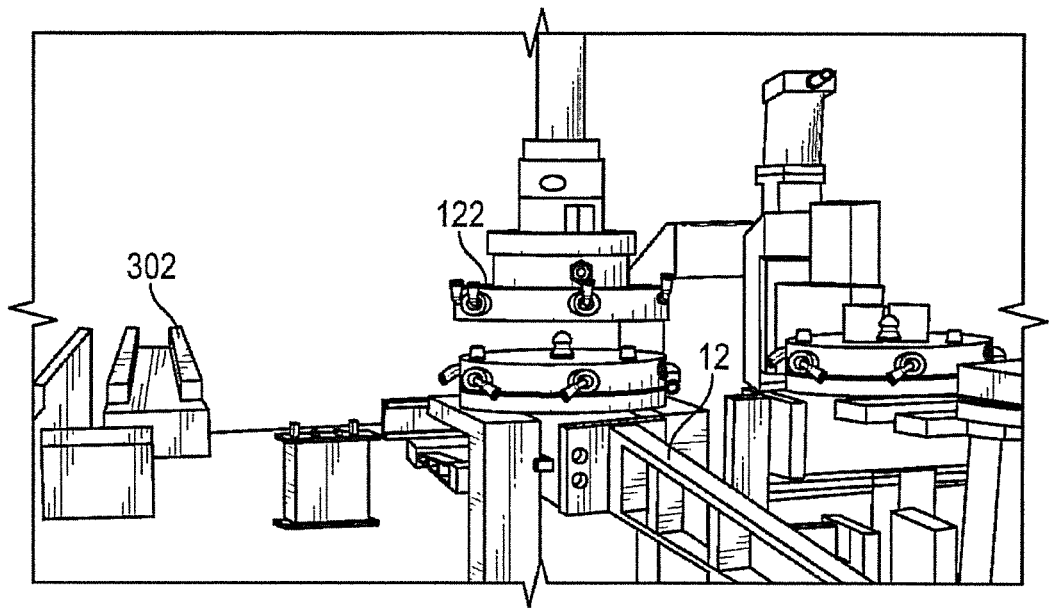
Figure 3:
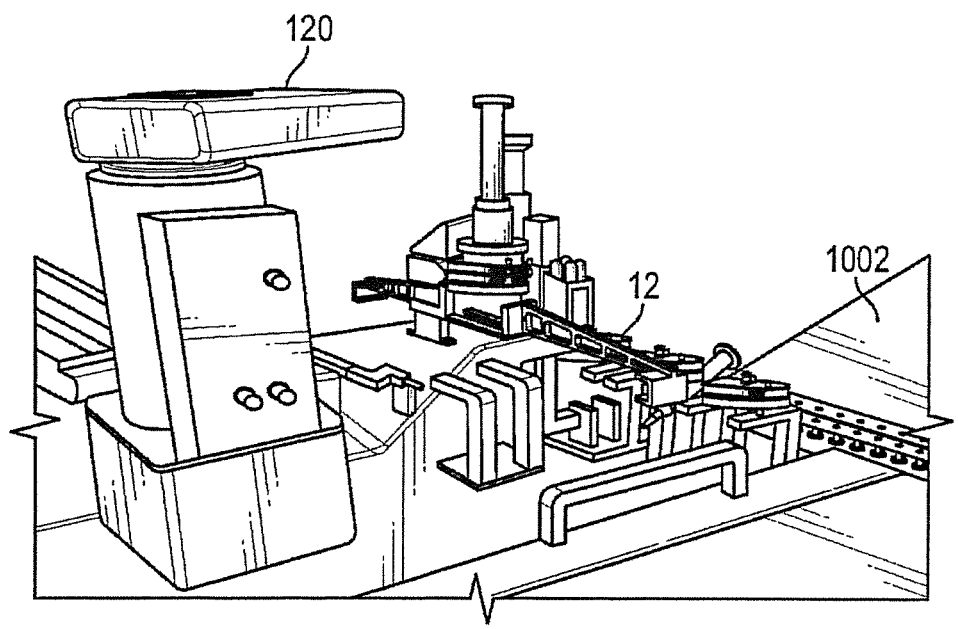
Figure 4:
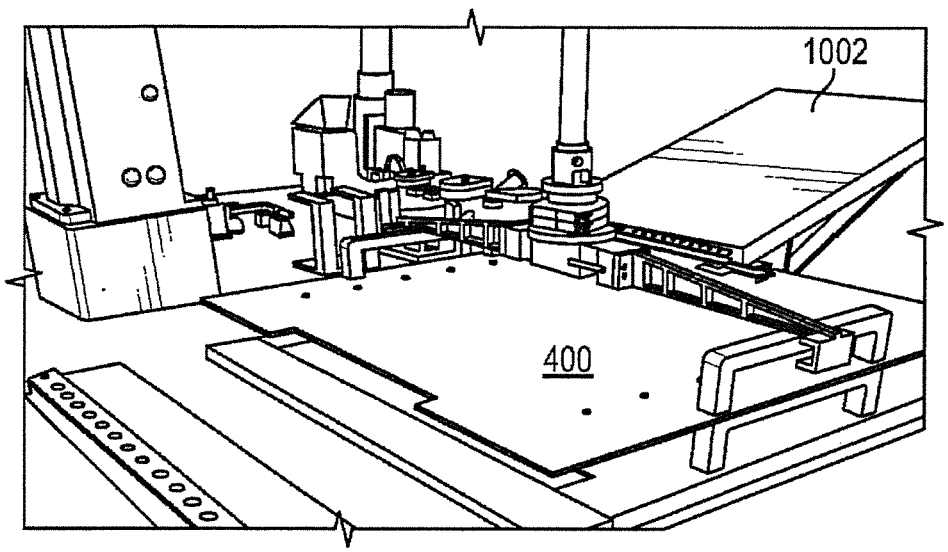
Figure 5:
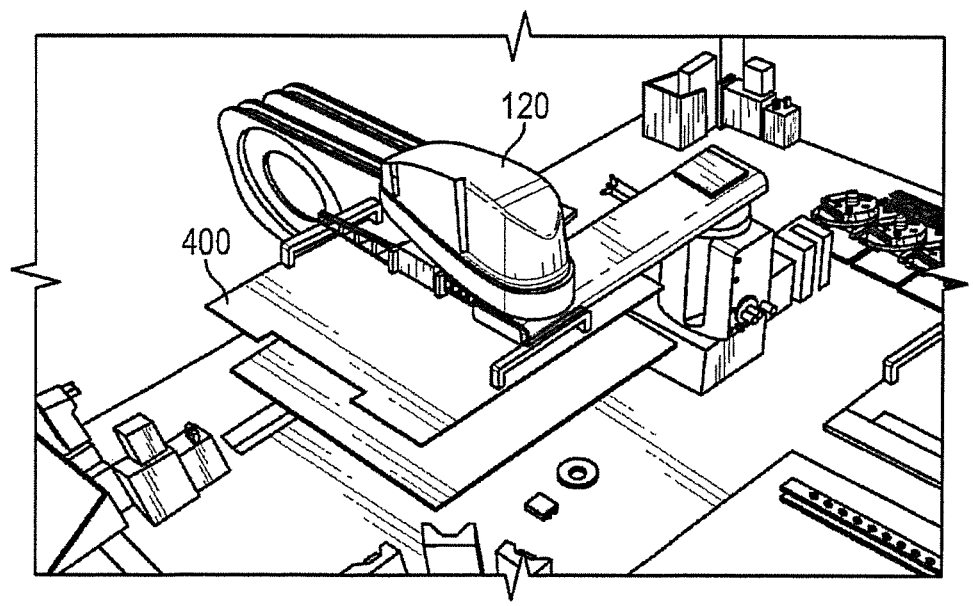
Figure 6:
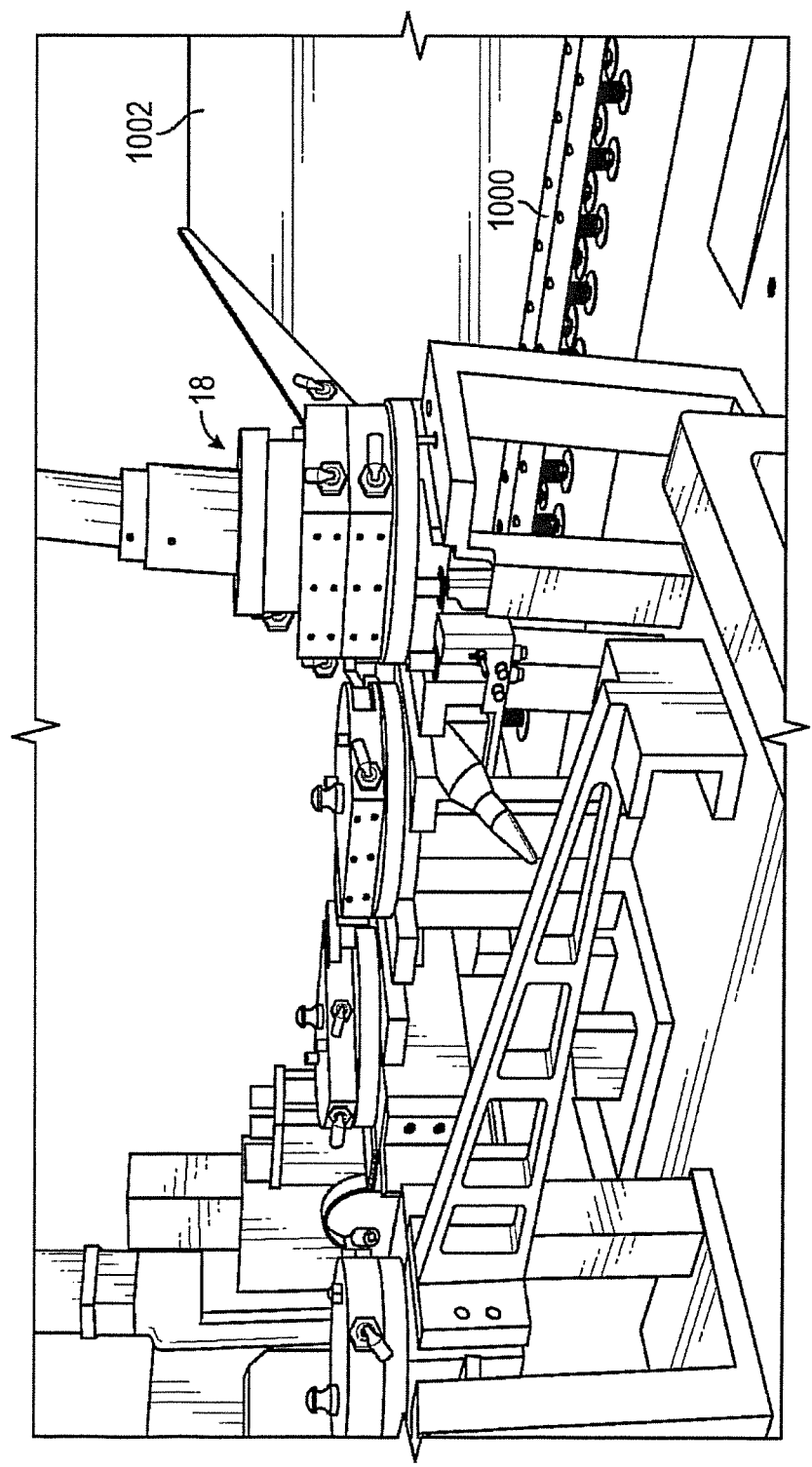
Figure 7:
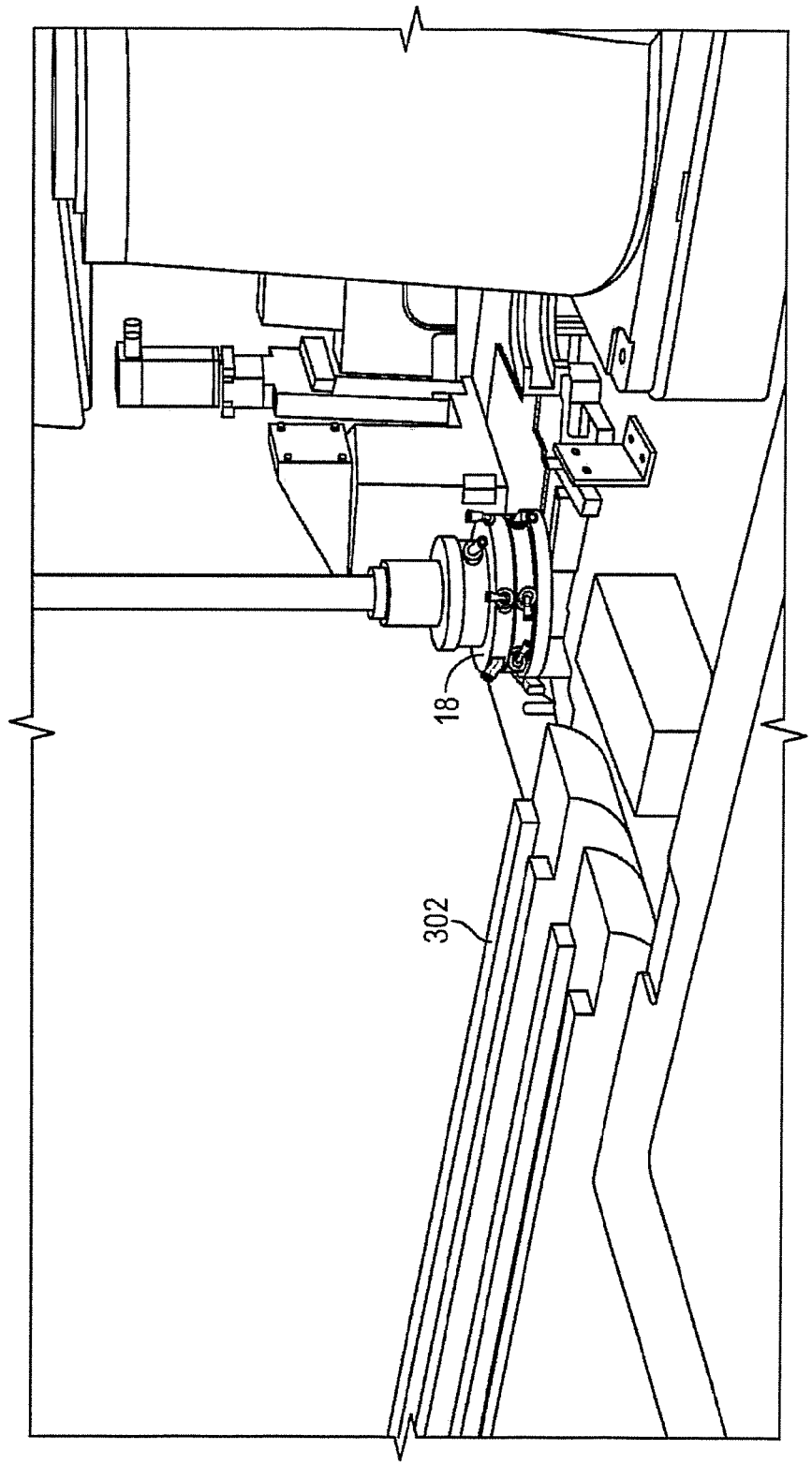
Figure 8:
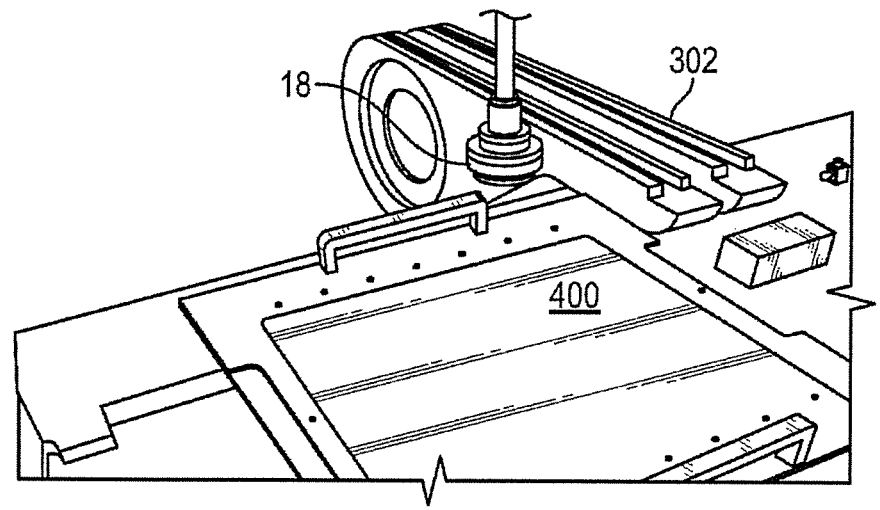
Figure 9:
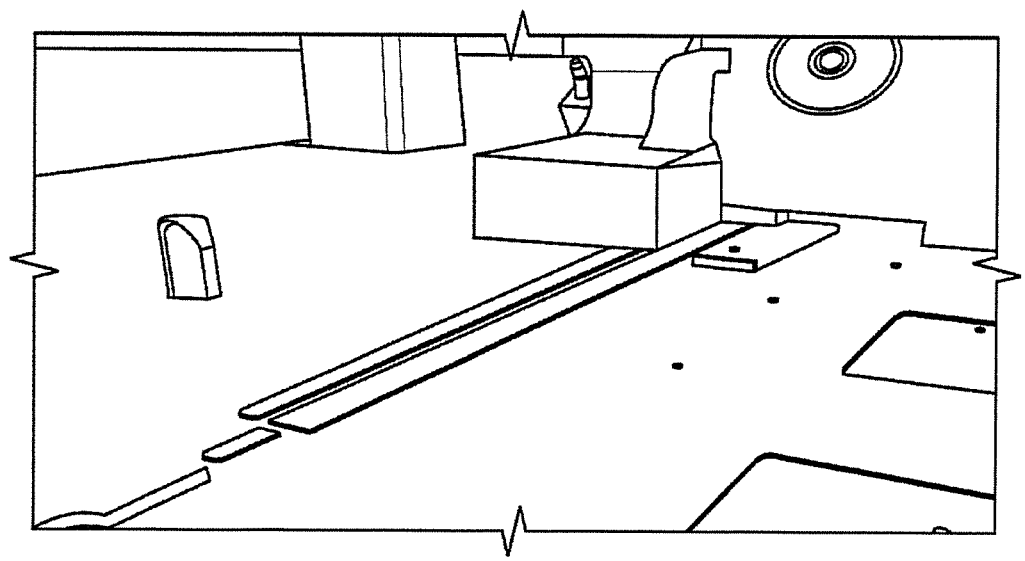
Figure 10:
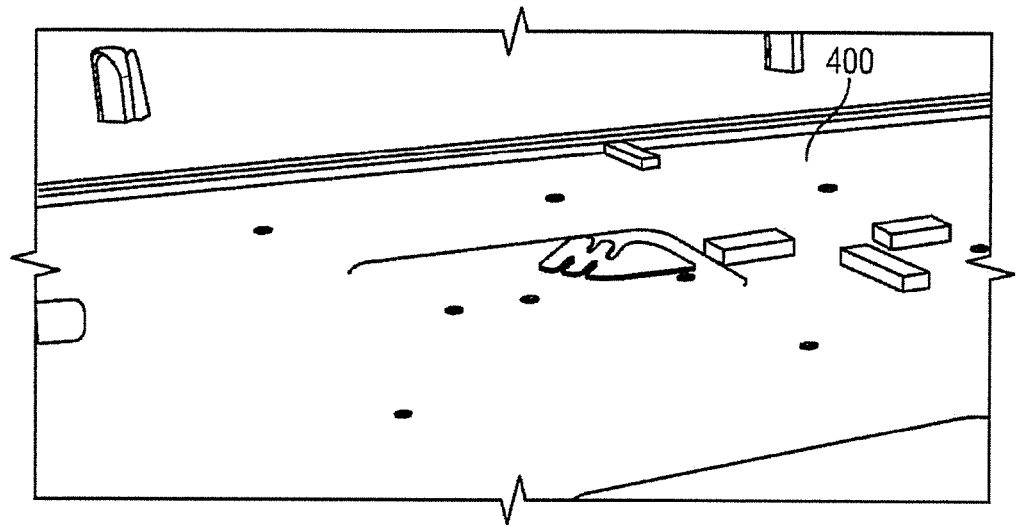
Figure 11:
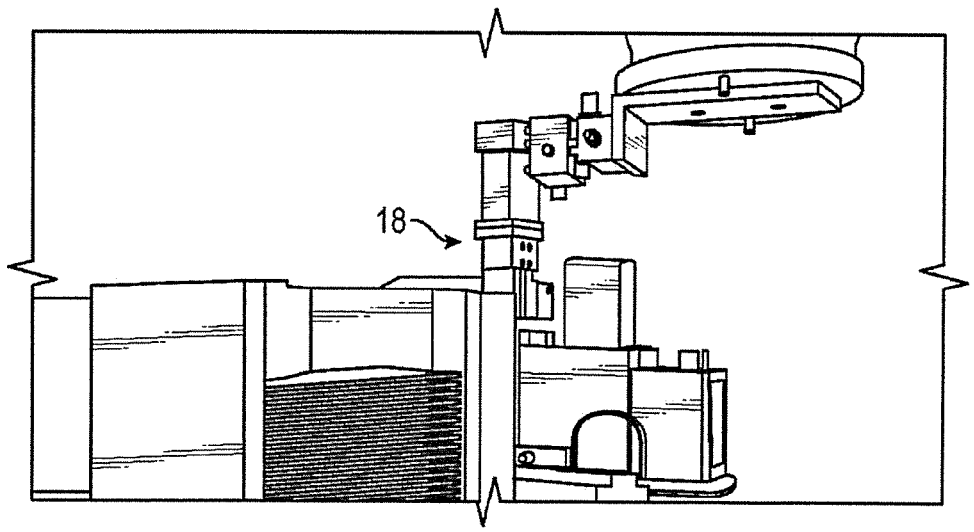
Figure 12:
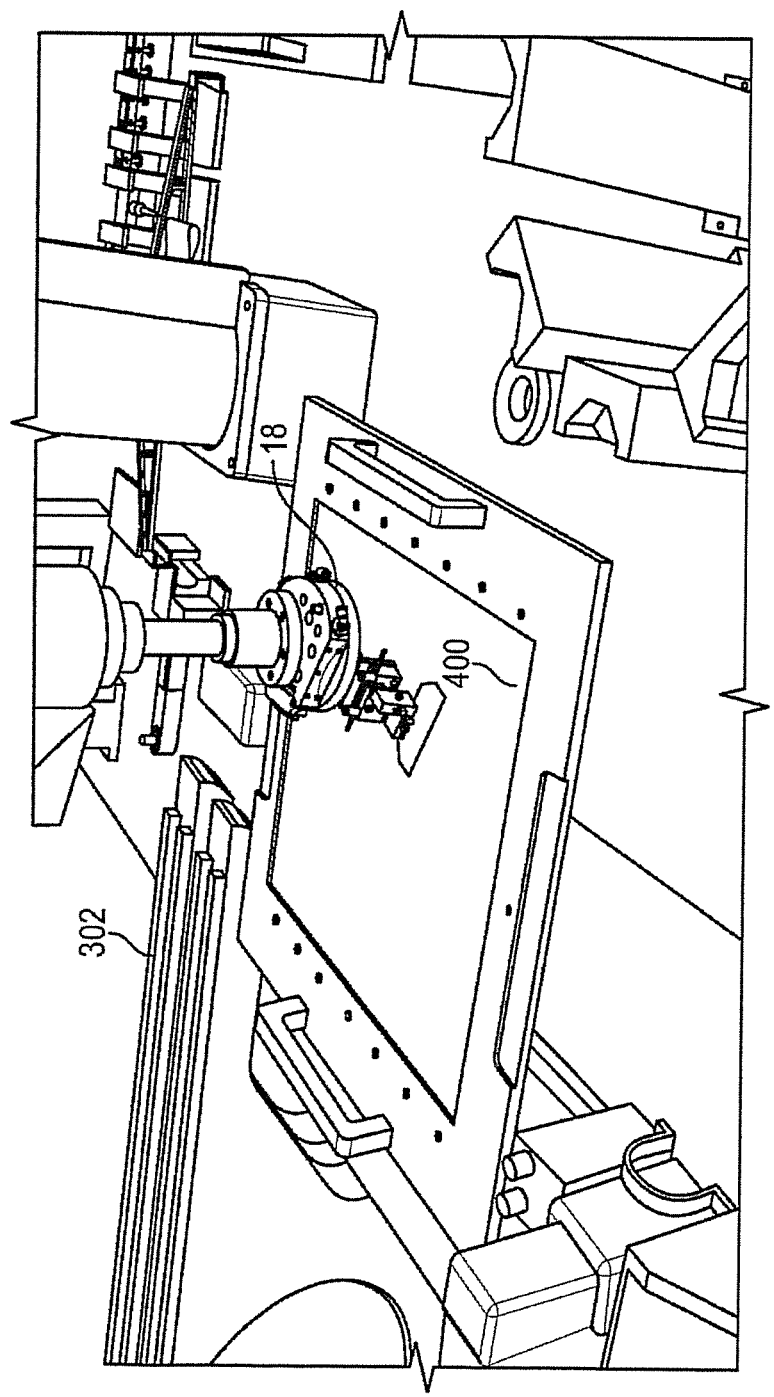
Figure 13:
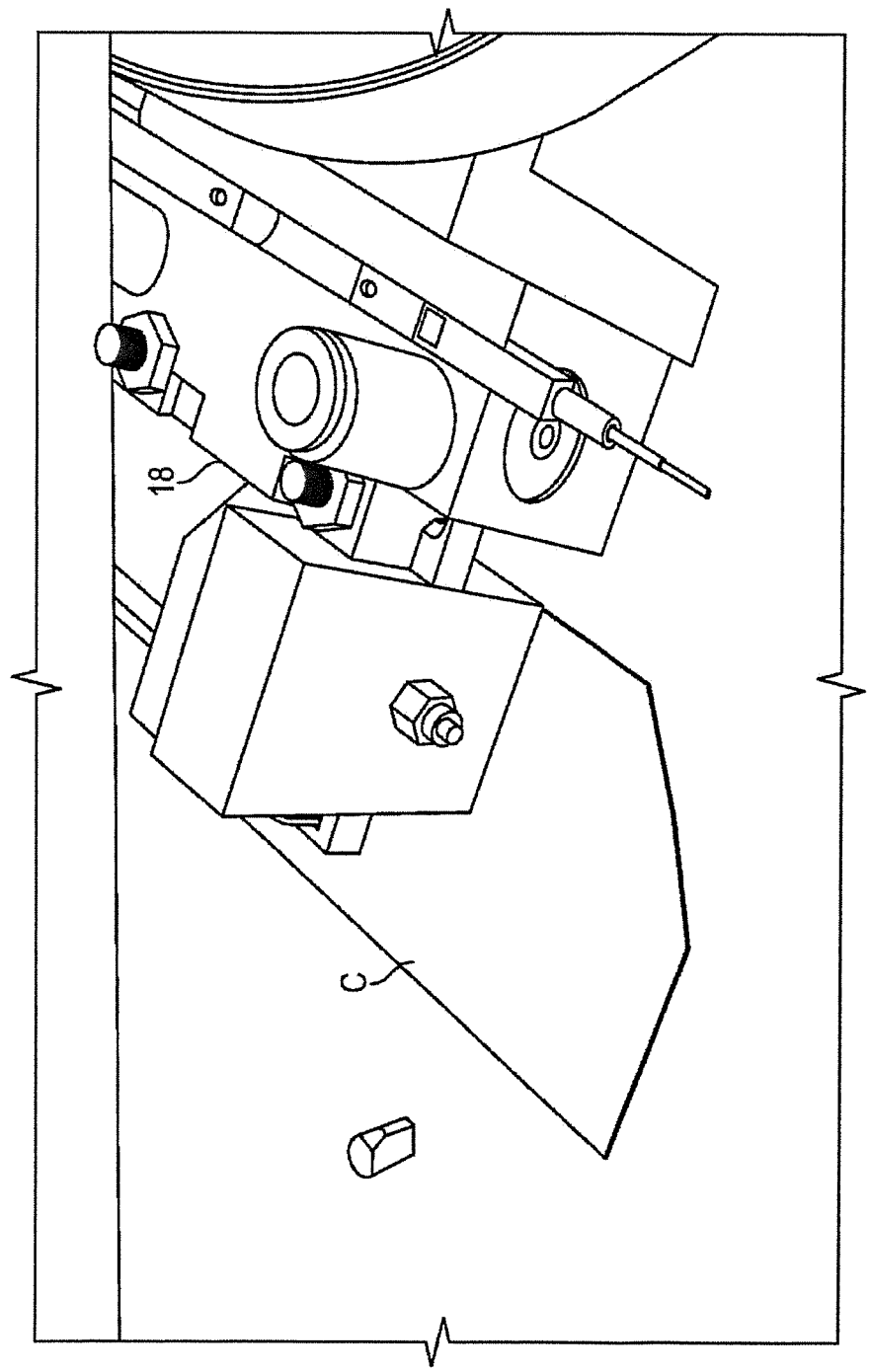
Figure 14:
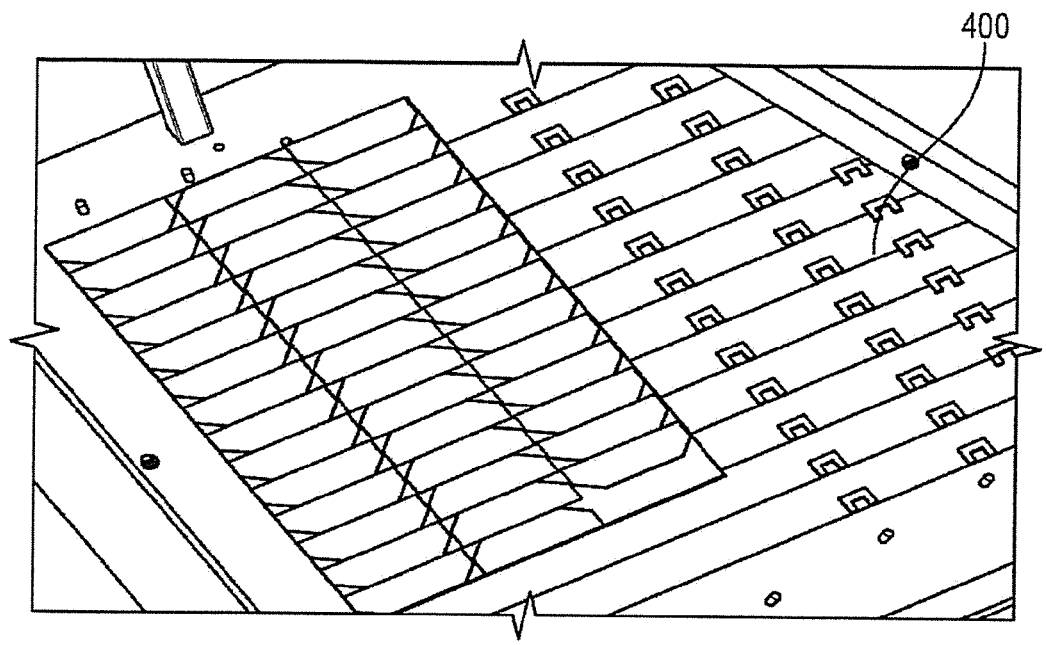
Figure 15:
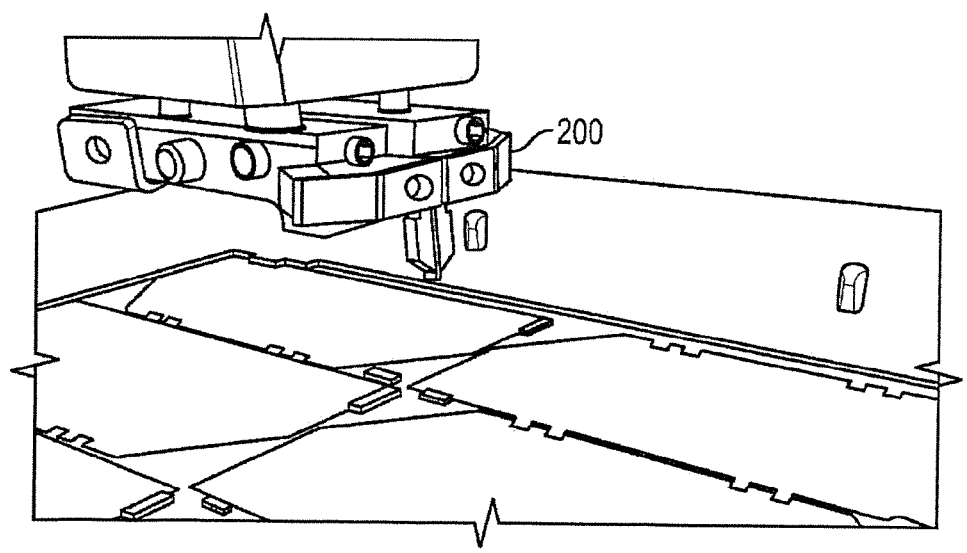
Figure 16:
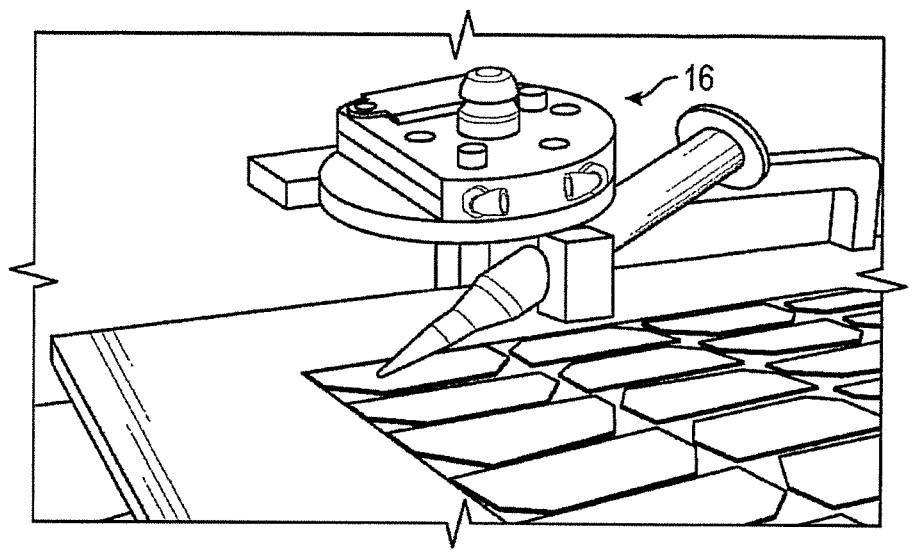
Figure 17:
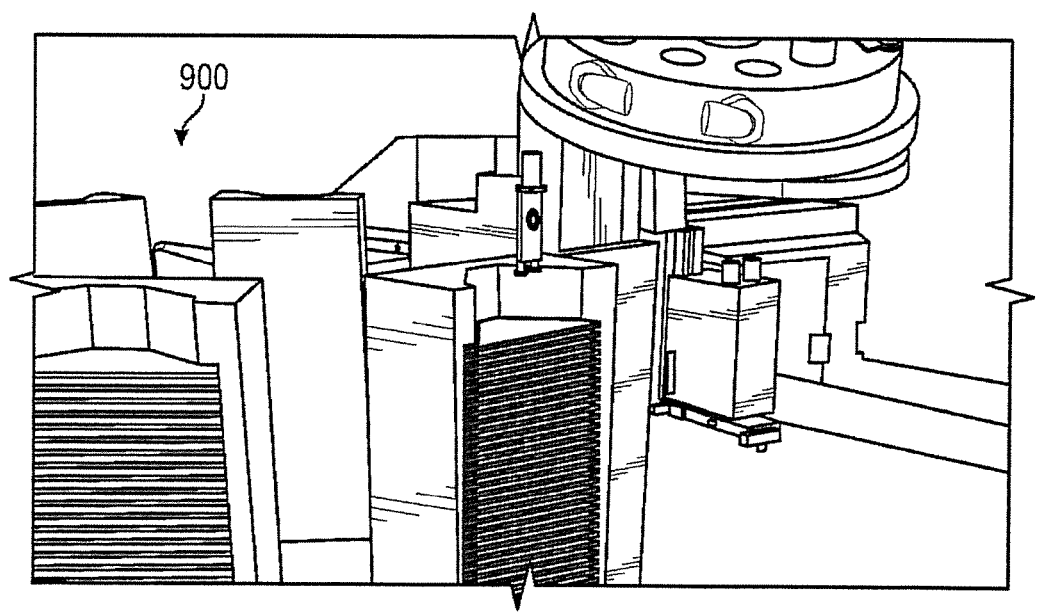
Figure 18:
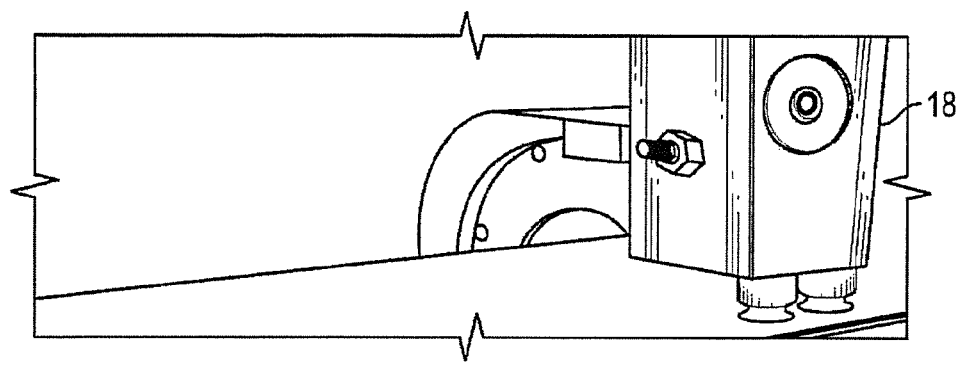
Figure 19:
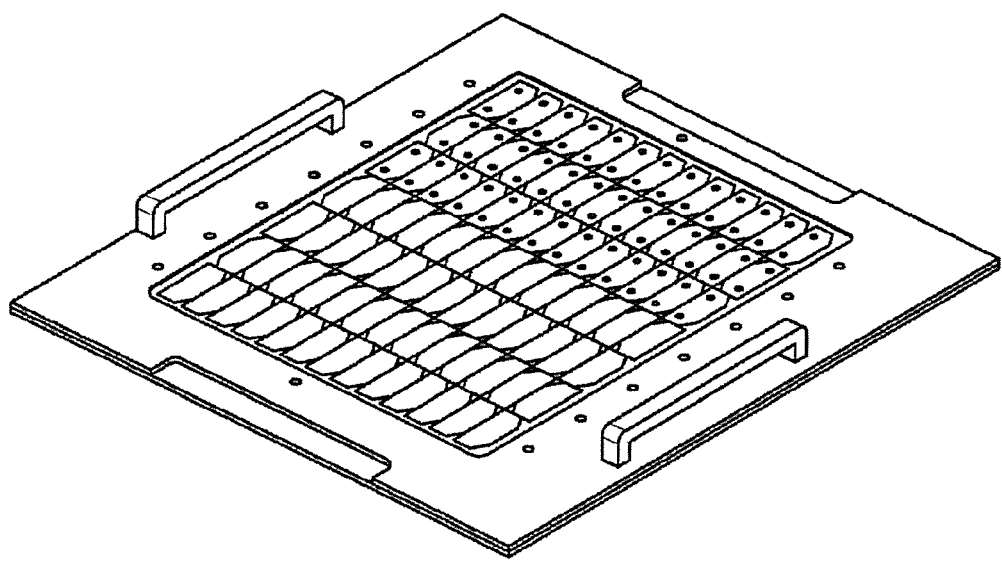
Figure 20:
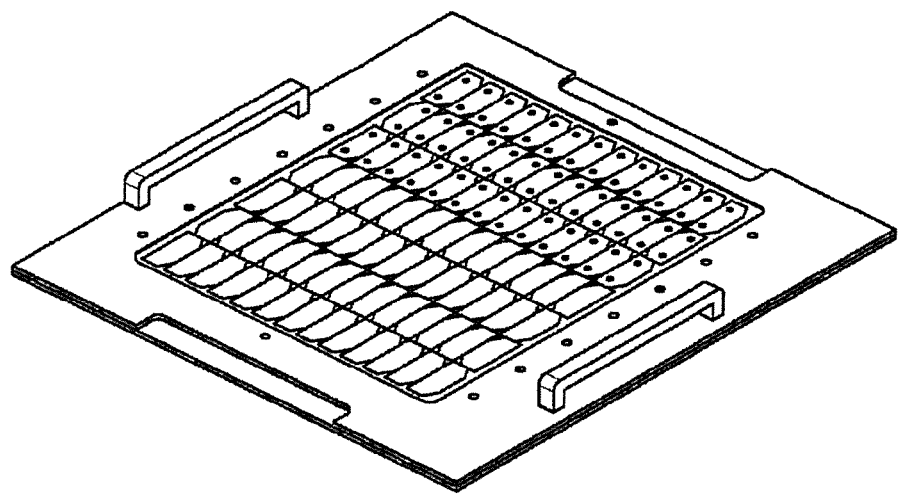
Figure 21:
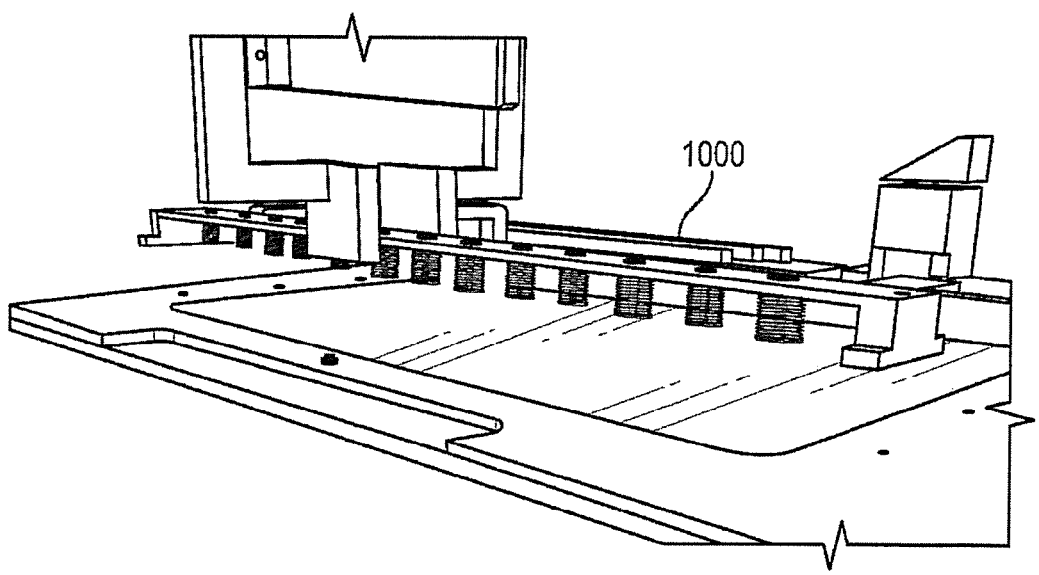
Figure 22:
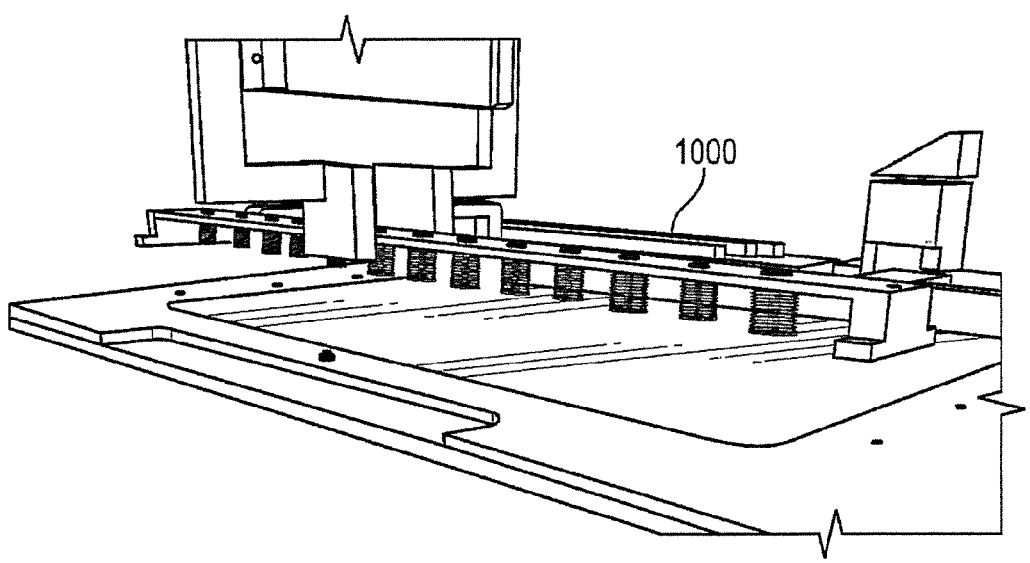
Figure 23:
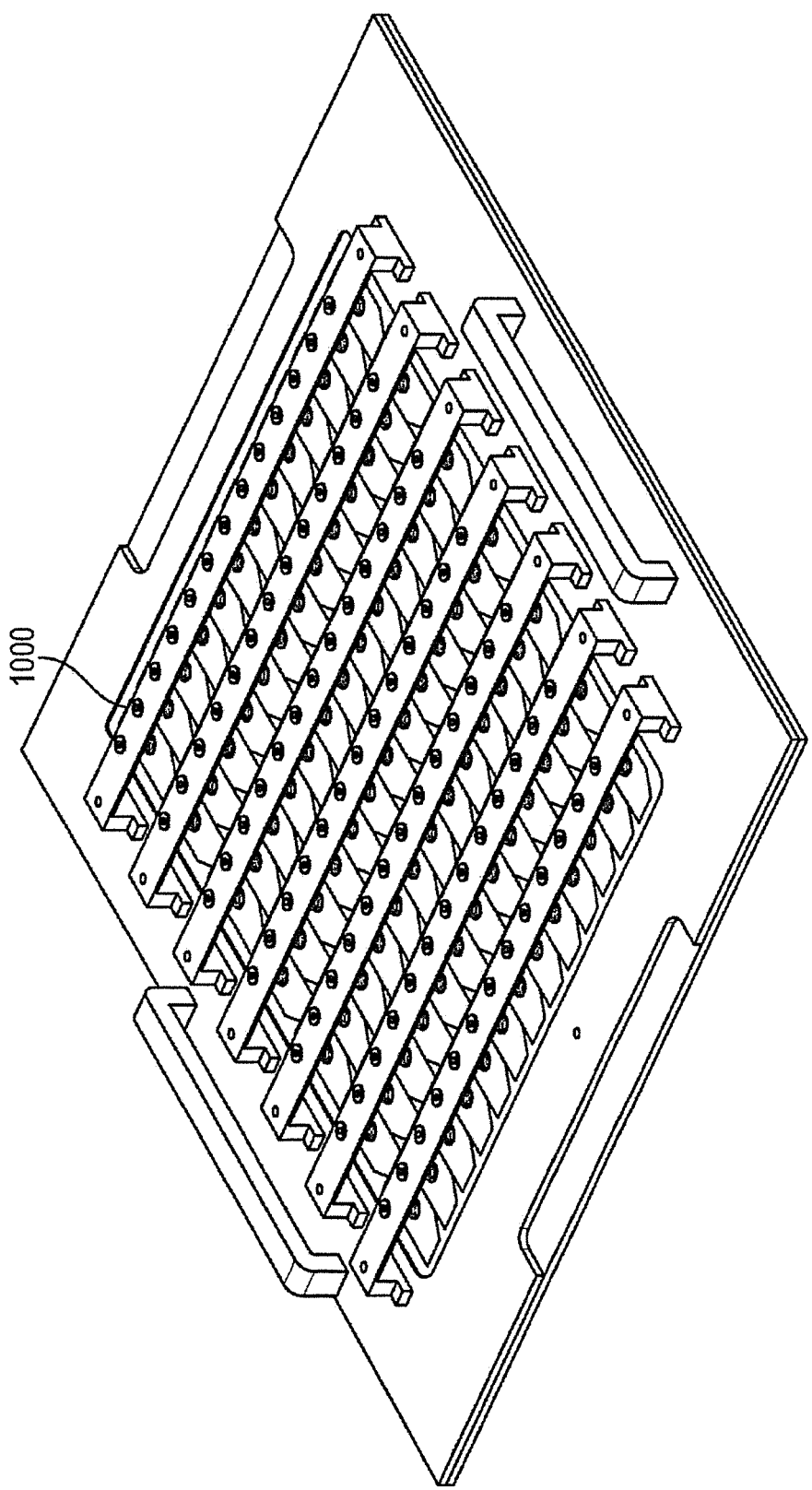
Figure 24:
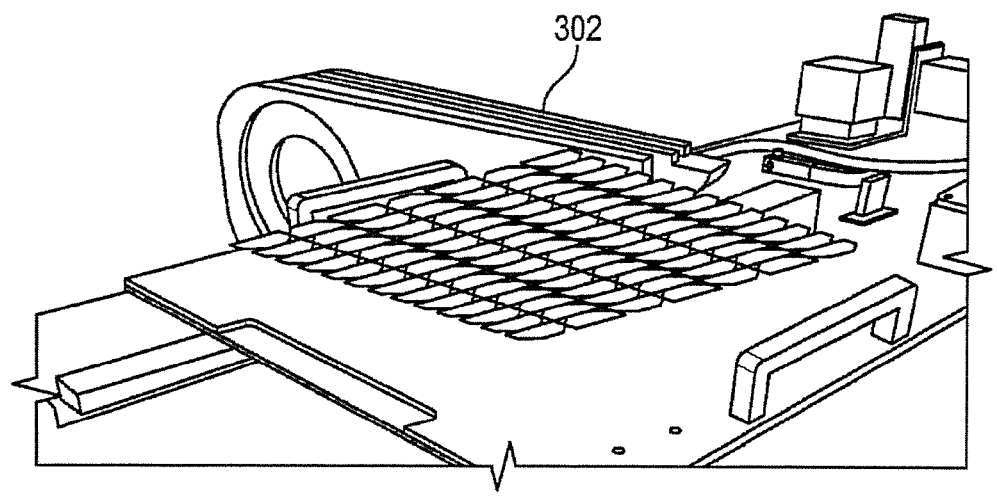
Figure 25:
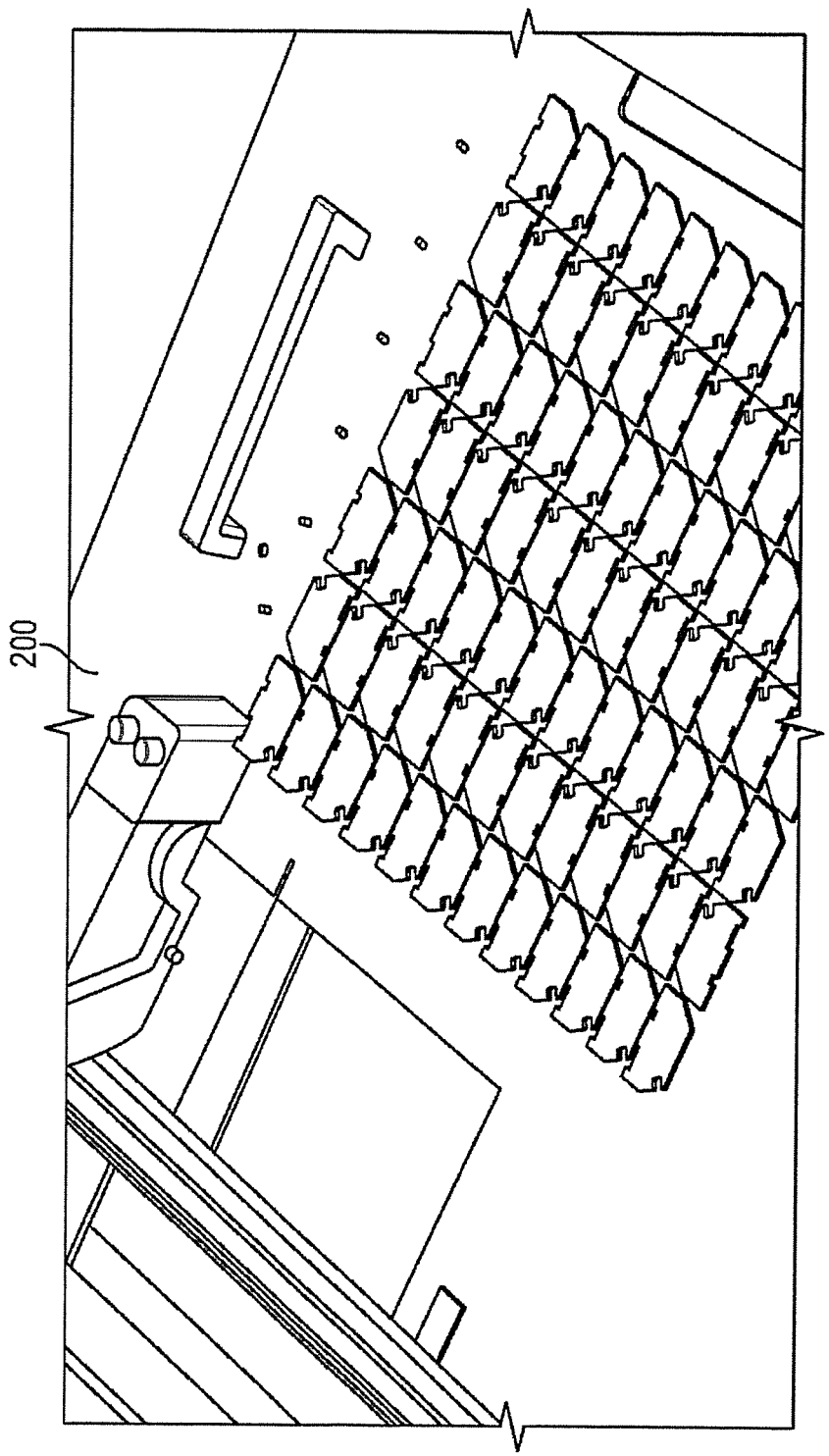
Figure 26:
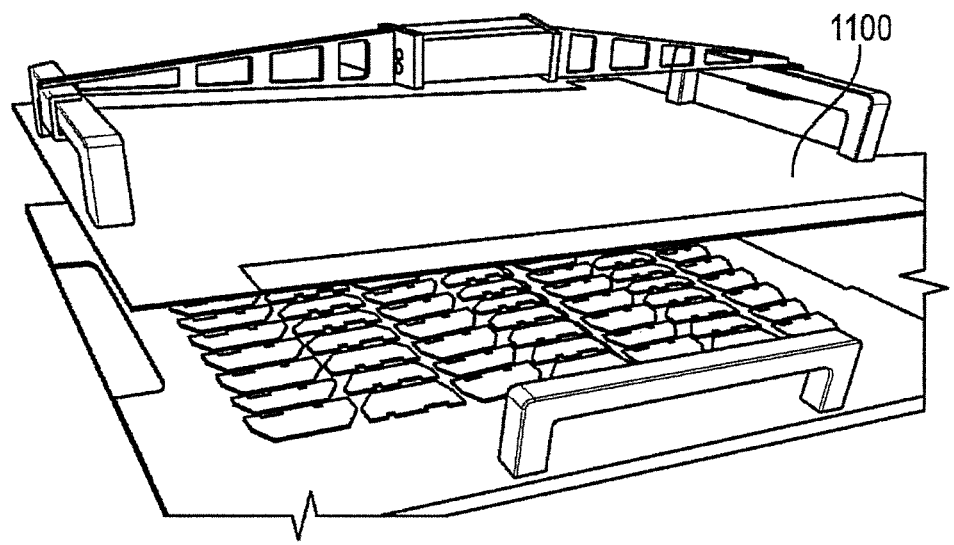
Figure 27:
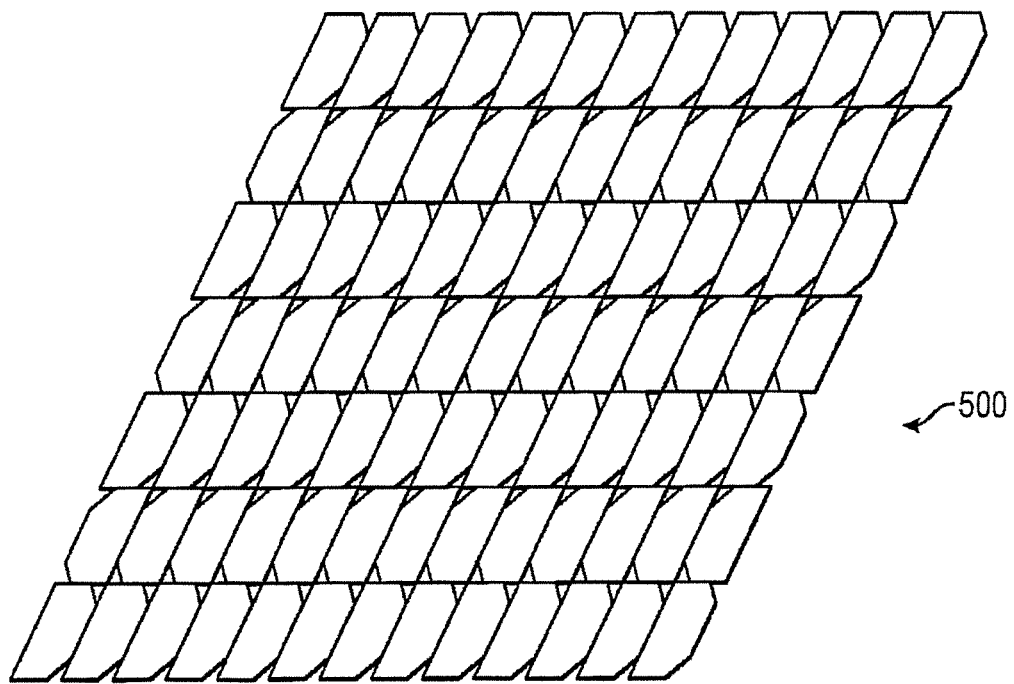
Figure 28:
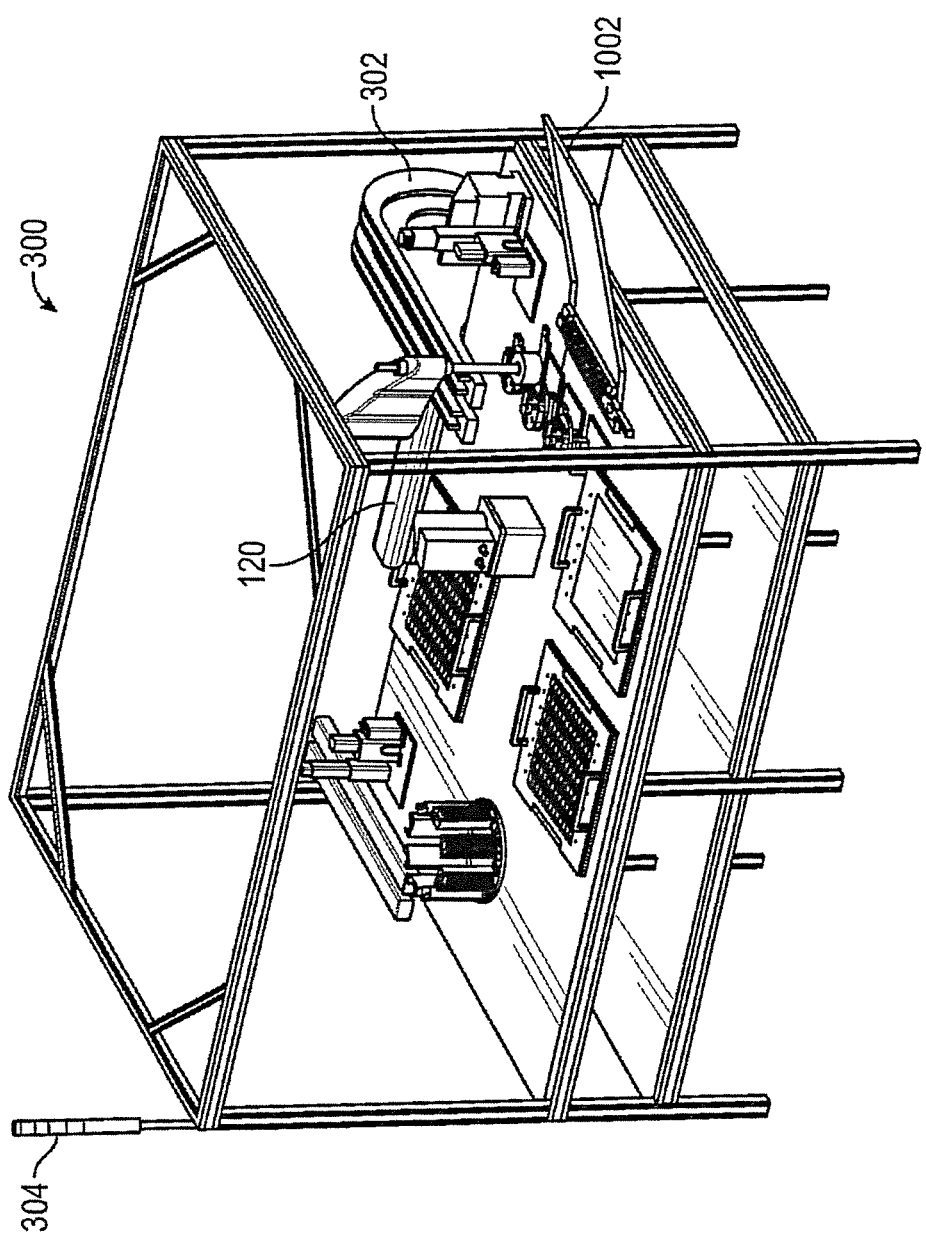
FIG. 28 depicts an embodiment of the manufacturing system showing the various subassemblies.
Figure 30:
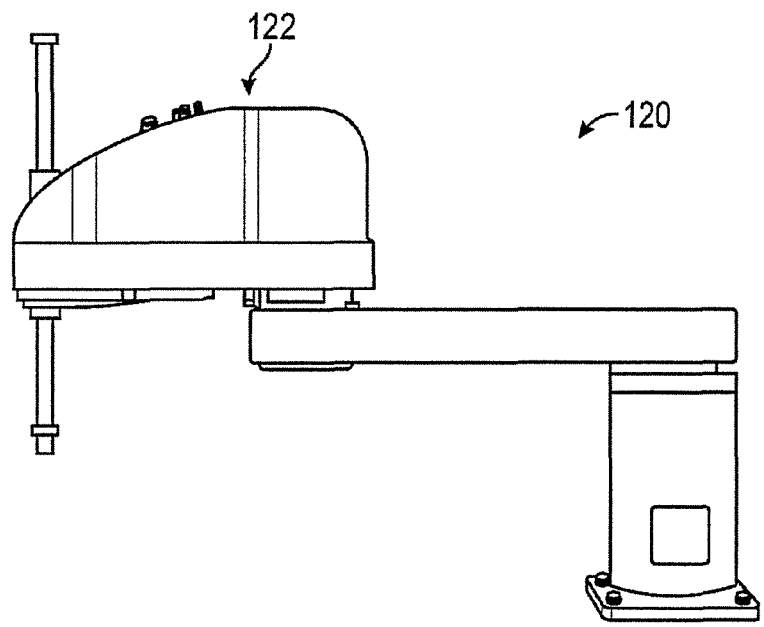
FIG. 30 shows an embodiment of a robotic system which may be utilized with the manufacturing system.
Figure 42:
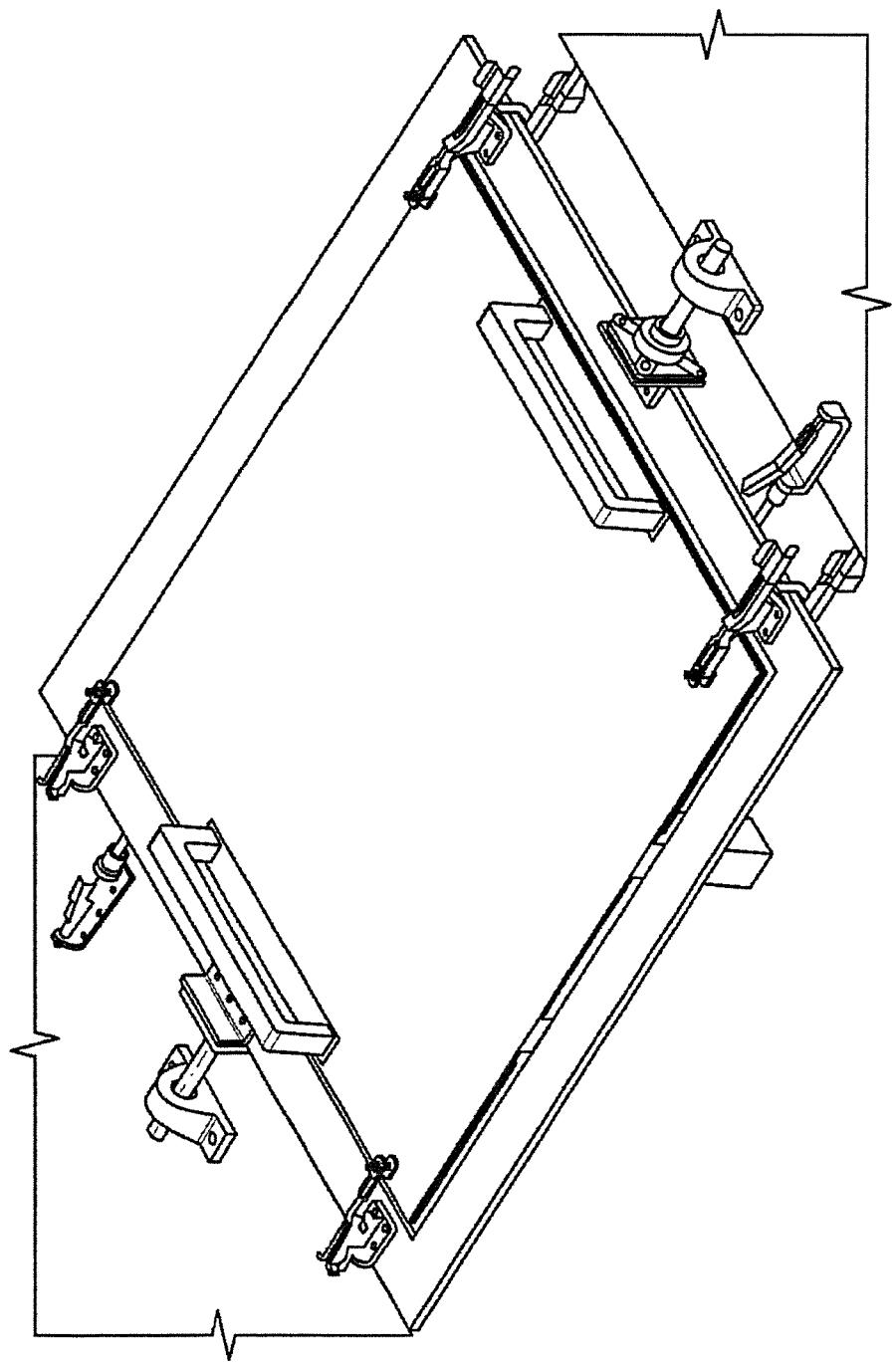
FIG. 42 depicts an embodiment of a string flipping assembly which is used external to the manufacturing system for turning an SPM.
Figure 43:
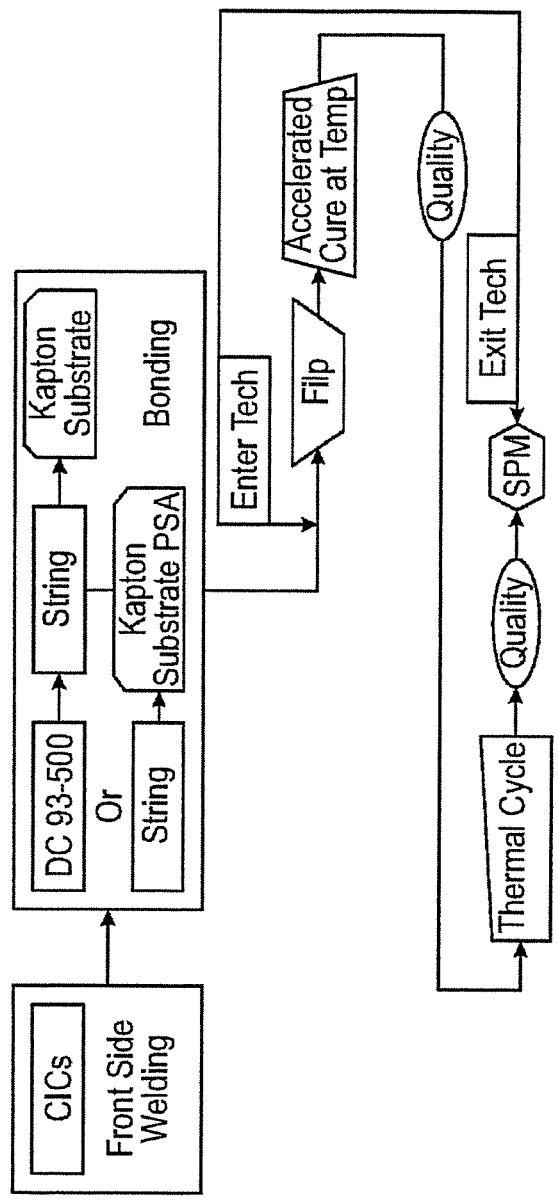
FIG. 43 is a flow chart showing a process for manufacture of CICs to SPMs utilizing embodiments of the disclosed system.
Figure 44:
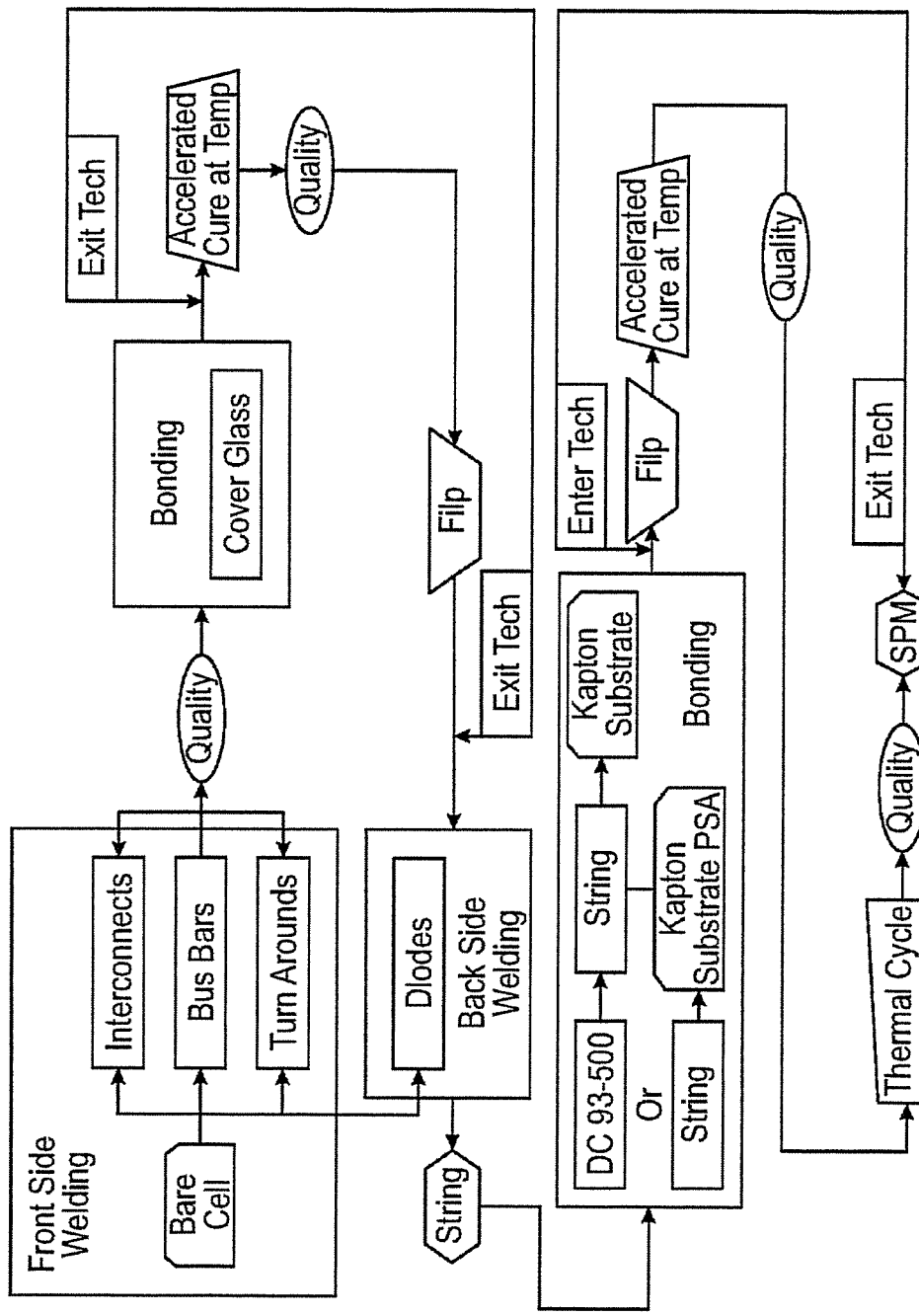
FIG. 44 is a flow chart showing a process for manufacture of bare cells to SPMs.
Figure 45:
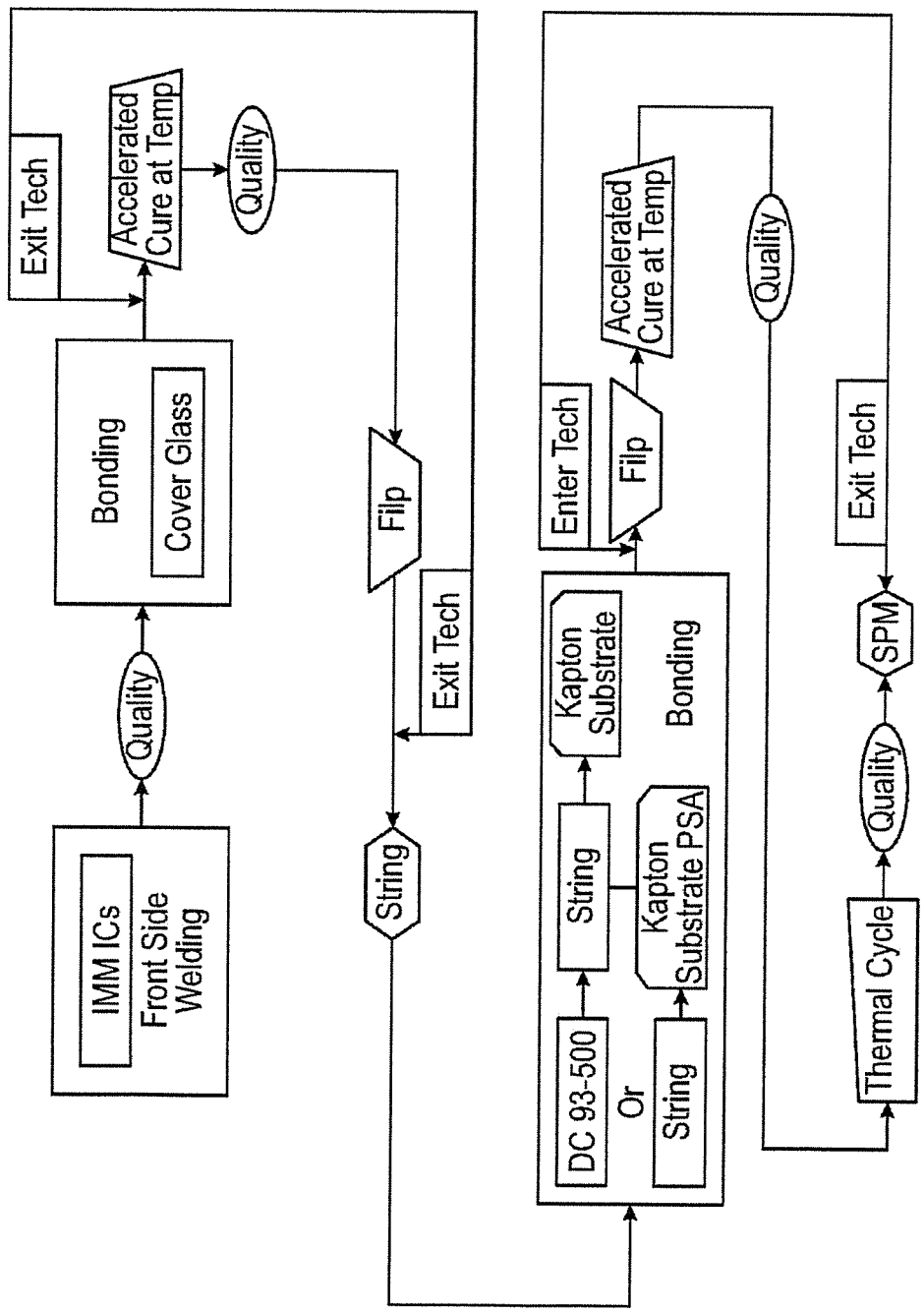
FIG. 45 is a flow chart showing a process for manufacture of IMM ICs to SPMs.

Referring now to the Figures, an embodiment of the manufacturing device 10 is depicted in FIGS. 1-27 in the process of fabricating an SPM 500, shown as completed in FIG. 27. FIGS. 28-29 show, respectively, a perspective view and a plan view of an embodiment of the assembly work station showing the major subassemblies. FIGS. 30-41 show close-up views of some of the components of the subassemblies. FIG. 42 shows an embodiment of a flipping assembly, used external to the work station, for turning over an SPM which is in the process of being completed. FIGS. 43-45 show flow charts for assembling SPMs from, respectively, CIC's, bare cells, and IMM ICs.

The manufacturing device 10 is configured to process both standard ZTJ/XTJ PV and emerging IMM PV. The manufacturing device 10 is also designed to manufacture interconnected cells (CIC's), and fully CIC'd cells (glassed) during periods of SPM fabrication downtime. The manufacturing device (also referred to herein as "work station") 10 may be housed within a safety enclosure 300, best depicted in FIG. 28, to protect personnel from the moving assemblies, although certain components, such as reel feeders 302 which provide consumable materials during the manufacturing process, may extend beyond the envelope of the safety enclosure 300 to facilitate the replenishment of the consumable materials. For additional safety, an indicator light 304 may extend above the safety enclosure 300 to communicate the operating status of the work station 10.

The manufacturing device 10 is configured to assemble bare cells, interconnects, diodes and cover glass into CICs—independently or at string level—to qualified flight standards. The manufacturing device provides front and backside welding of CICs and bare cells, controlled dispensation of adhesive onto the front of bare cells, and to accommodate the current, state of the art, ZTJ cell configuration and future PV sizes and technology. The possible PV options include, but not limited to, IMM, Super Cell, Microlink and Single Cell per wafer designs.

The manufacturing device will place and weld CICS, bus-bars and turn-arounds in variable string configurations (length and shape), because of the flexible nature of the utilized robotics and controlling software, including a string design up to seven cells wide and thirteen cells deep.

The manufacturing device is capable of adhering completed strings to a multitude of substrate materials, such as Kapton with pressure sensitive adhesive, Kapton with dispensed and metered adhesive, and Mylar employing a weak adhesive for transfer to a rigid panel.

The manufacturing device is capable of performance validation of CICs, strings and SPMs by employing various means of investigating cell, string, or SPM integrity. One such means of validation utilizes either InfraRed or the visible spectrum to identify structural issues within the CIC, string or SPM. Visual cameras may be utilized to verify the positional accuracy of features within these same assemblies. For example, proper diode location, cell spacing, bus-bar and turn-around location, interconnect placement and bonded coverglass tolerance.

Embodiments of the manufacturing device 10 utilize a robot 120 as a pick-and-place machine. An acceptable robot 120 is the Epson SCARA type robot because of its inherent circular work space area and accommodation of conveyor applications. The robot utilizes an effector tool interface 122 with pneumatic tool changers to allow the use of a single robot 120 with multiple tools to execute multiple operations. The robot 120 will typically have a predetermined "safe position" which places the arm 122 of the robot away from all cell, interconnect, SPM and coverglass materials, testing equipment, linear motors and sensors. The safe position is, instead, directly over the tool changers and with the Z-axis fully retracted to eliminate possible interference issues with surrounding hardware should a failure occur. Robot 120 works in conjunction with a collection of end effector tools, which are necessary to perform all necessary automated tasks within the work station. The collection of end effector tools may comprise the following: (1) SPM tray carrier 12, preload bar pickup 14, adhesive dispenser 16, and cell/interconnect vacuum assisted pickup mechanism 18, which allows the robot 120 to pick up and position diodes, interconnects and busbars onto the SPM assembly tray 400. FIGS. 37-40 depict embodiments of the end effector tools in greater detail.

Figure 31:
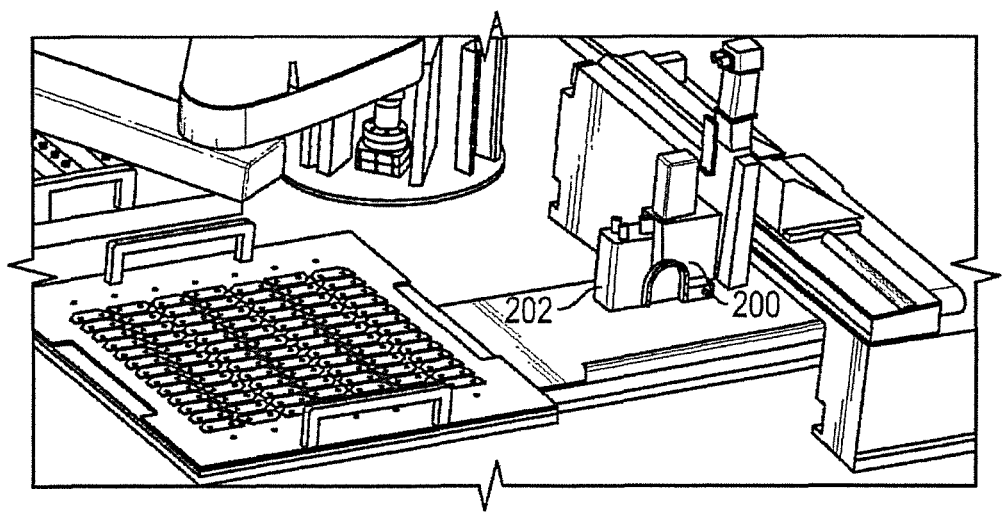
FIG. 31 depicts an embodiment of an X-Y-Z string welding station which may be utilized with embodiments of the invention.

FIG. 31 depicts a string welding station 200 which enables loose cells, interconnects, diodes, bus-bars and turnarounds to be welded into fully functional string in situ. Following automatic placement of the of these various components by the robot 120, utilizing vacuum assisted pickup mechanism 18, X and Y linear motors position the required weld points beneath the weld head 202. X-axis translation of the SPM welding tray may be achieved with a Parker 412LXR Linear Motor Stage. Y-axis translation of the weld head may be controlled with a Parker 406LXR Linear Motor Stage.

The inventors herein have determined that the Unitek 72 weld head unit and the associated UB-25 power supply provide acceptable service for weld head 202. The weld head 202 is mounted to a Z axis linear motor for vertical positioning. An acceptable Z axis linear motor is a Parker 404XR 500 mm travel ballscrew stage. Weld head 202 and the Z axis linear motor are in turn mounted to the Y axis linear stage. An optional, battery powered, absolute encoder may be utilized with both the X and Y linear motors to prevent the possibility of the system losing its positional awareness along its axis should power be lost.

Figure 32:
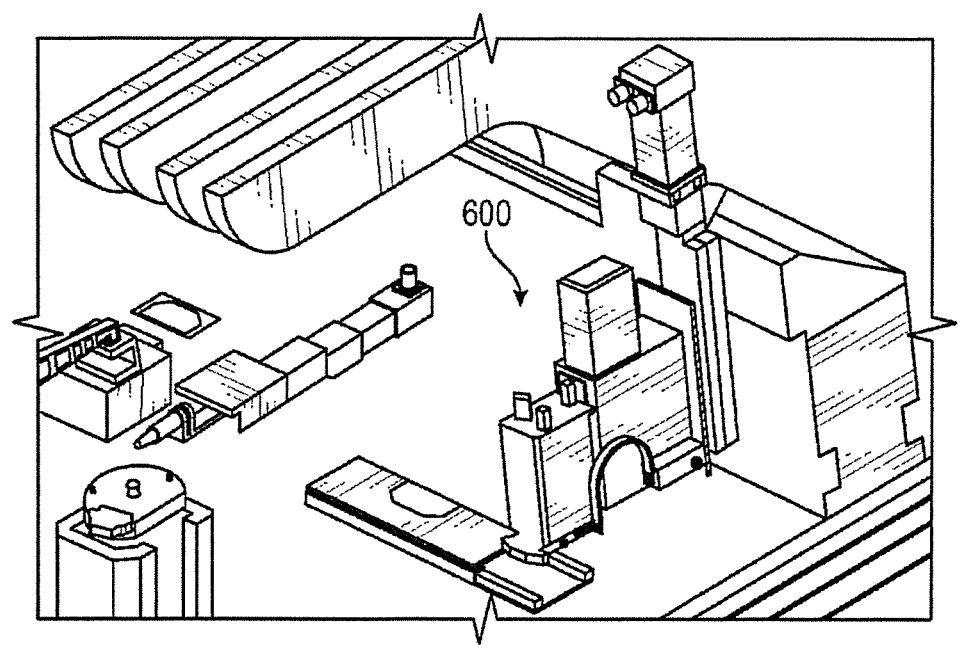
FIG. 32 depicts a single IC'ing station which may be utilized with embodiments of the present invention to enable the weld qualification and characterization of each welded cell. The single IC'ing station consists of a single Y-axis linear motor stage, a Unitek weld head, a power supply, and a weld load cell pull tester.

As depicted in FIG. 32, an embodiment of the manufacturing device 10 may comprise a single IC'ing station 600. The single IC'ing station 600 takes advantage of the SPM manufacturing down time and allows the weld qualification and characterization of each welded cell. The single IC'ing station comprises a single Y-axis linear motor stage, a weld head assembly (Unitek 72 with UB-25 power supply is acceptable), weld load cell pull tester, and a cell flipping mechanism.

Figure 33:
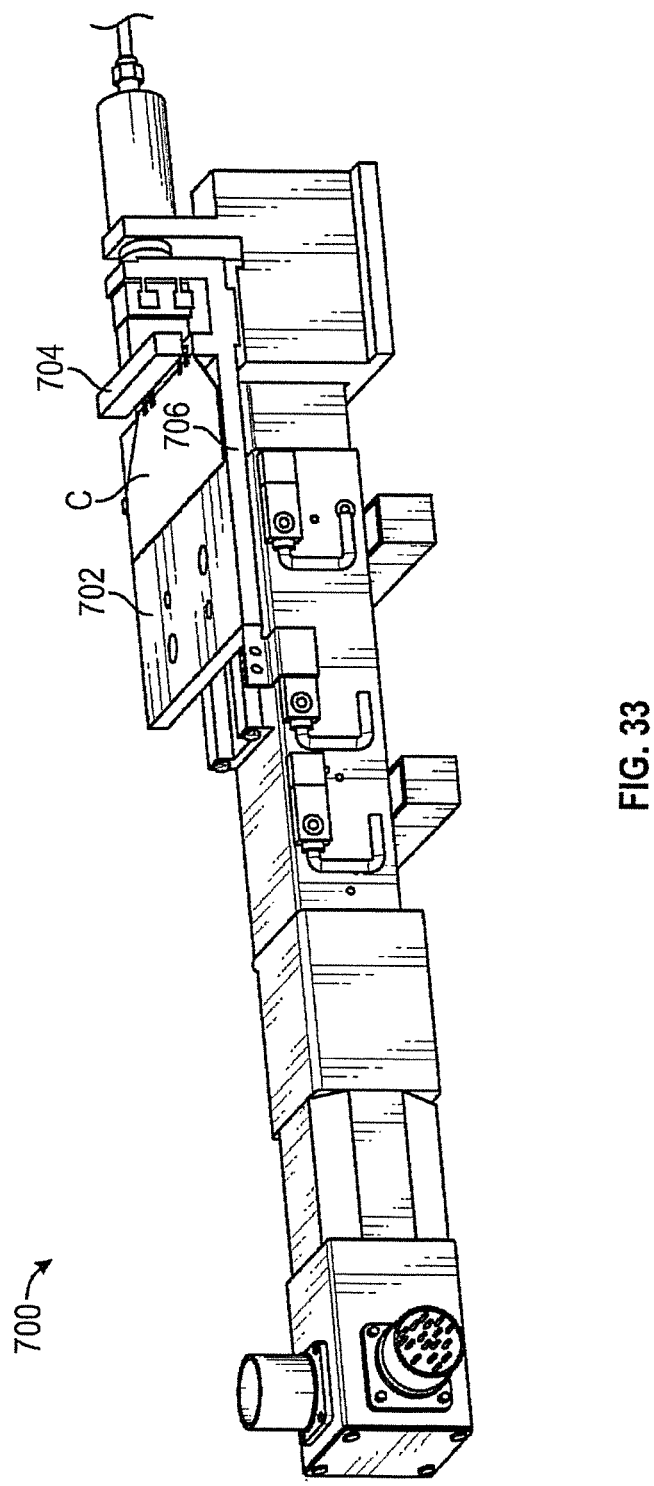
FIG. 33 depicts an interconnect weld force tester assembly which may be utilized with the IC'ing station in embodiments of the invention.

FIG. 33 depicts an interconnect weld force tester assembly 700. The purpose of the weld force tester assembly 700 is to verify that the cell to interconnect weld strength exceeds the applicable standard. The weld force tester 700 comprises a single axis ballscrew stage, a cell plate with integrated vacuum, a load cell, a ball slide and rail, and a pneumatic gripper. In action, the robot 120 places an cell C onto a vacuum plate 702 with the interconnects positioned off the edge of the plate and on the side of gripper 704. The single axis stage then moves the interconnects between the retracted jaws of the gripper 704. The gripper 704 is actuated and pinches the interconnects to restrain the IC while undergoing in-plane loading. The stage 706 moves away from the gripper 704 until a predetermined load is registered on the load cell. Upon conclusion of the test, the stage 706 relaxes, the gripper 704 is released and the stage 706 moves back to its original position of the robot 120 may access the IC for the next step in the process.

Figure 34:
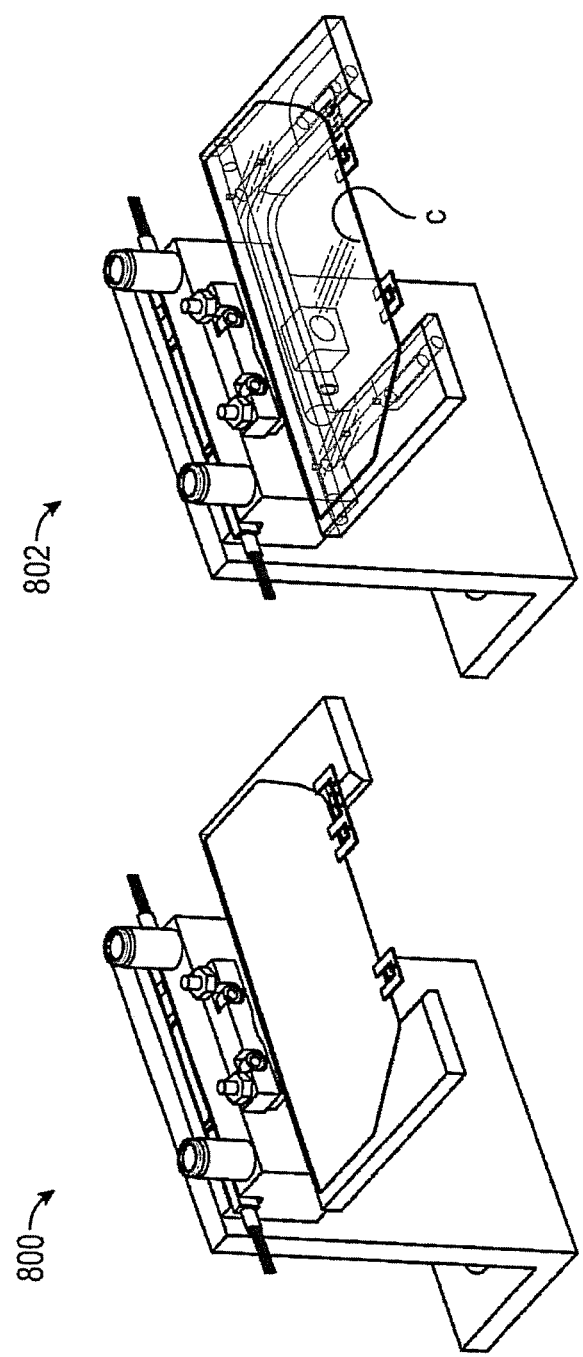
FIG. 34 depicts a cell flipper mechanism which may be utilized with the IC'ing station in embodiments of the invention.

FIG. 34 depicts an embodiment of a cell flipper 800. During the IC'ing process, it is necessary to flip the cell C 180 degrees so that the diode may welded onto the back of the cell. Cell flipper 800 provides this service. Cell flipper utilizes an actuator and a vacuum tray to hold the cell. The actuator (which may be a SMC CRJU1-180-M9NWL actuator) has a 180 degree rotary configuration with a hardstop-to-hardstop motion. FIG. 34 shows two view of the cell flipper 800, showing an IC on the vacuum tray with opaque rendering on the left side and as transparent on the right side, so that the underlying vacuum port detail of the interface plate 802.

Figure 35:
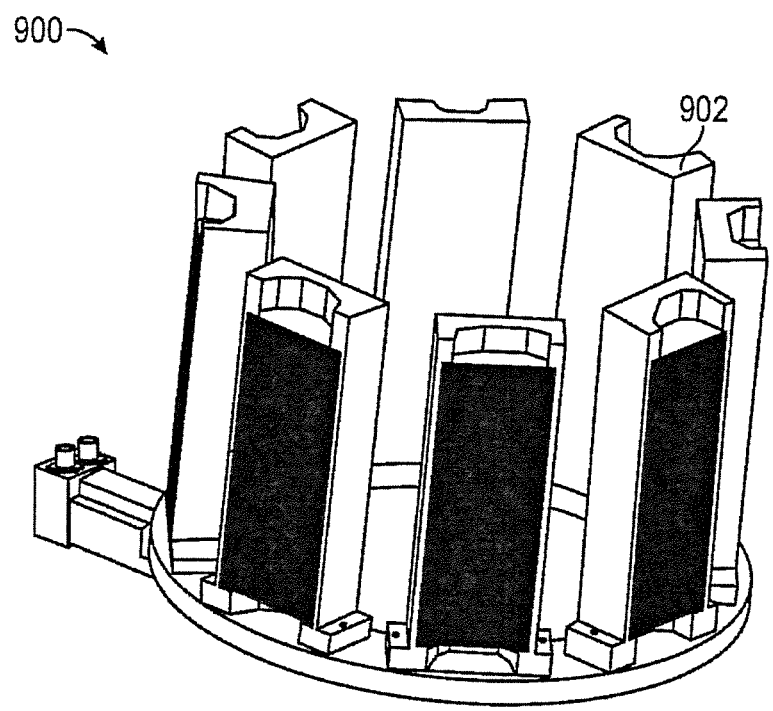
FIG. 35 depicts an embodiment of a carousel mechanism which may be utilized to house bare cells, cover glass, ICs or CIC's, this embodiment having sufficient storage to manufacture four full-sized 91-cell SPMs.

FIG. 35 depicts an embodiment of a carousel 900 to support the various SPMs and individual ICs, and cover glass. The embodiment of carousel 900 depicted in FIG. 35 may utilize a Parker RT212 worm drive rotary stage and removable storage cassettes 902. The cassettes may be configured to hold bare cells, cover glass, ICs or CICs. For example, the cassettes 902 may hold sufficient components to manufacture four full-sized 91-cell SPMs. Ample clearance is provided to allow the robot end effector tools access to the entire cassette during loading and unloading events. Robot 120 may utilize vacuum assisted pickup mechanism 18 for placing each of these components.

Figure 36:
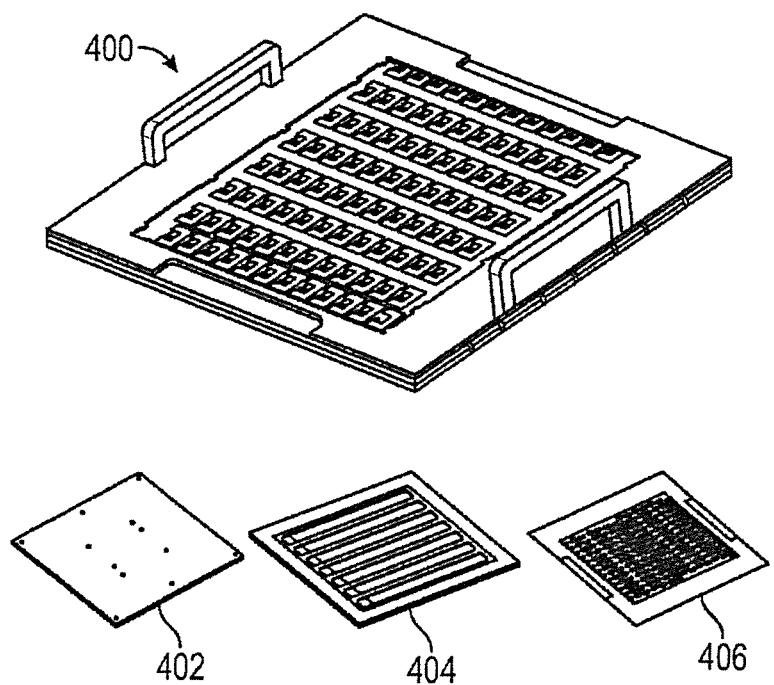
FIG. 36 depicts an embodiment of a SPM stringing vacuum tray assembly, showing, from left to right below the full figure, the SCP interface, vacuum, and assembly trays.
Figure 37:
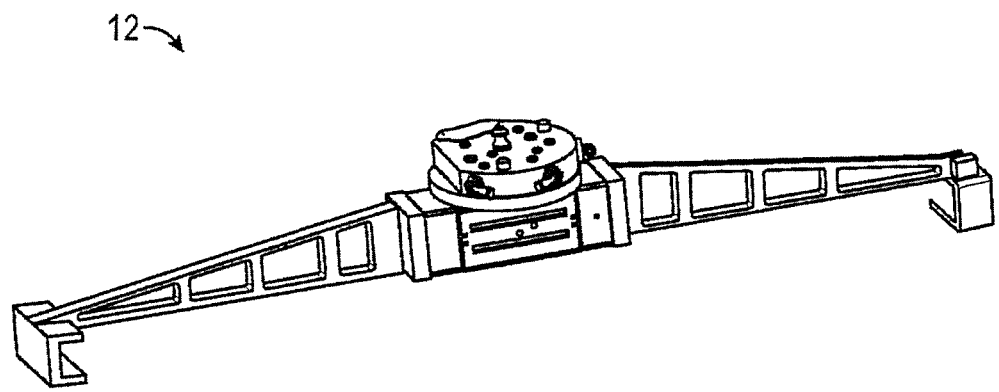
FIG. 37 depicts an embodiment of a SPM pick-up tool.
Figure 38:
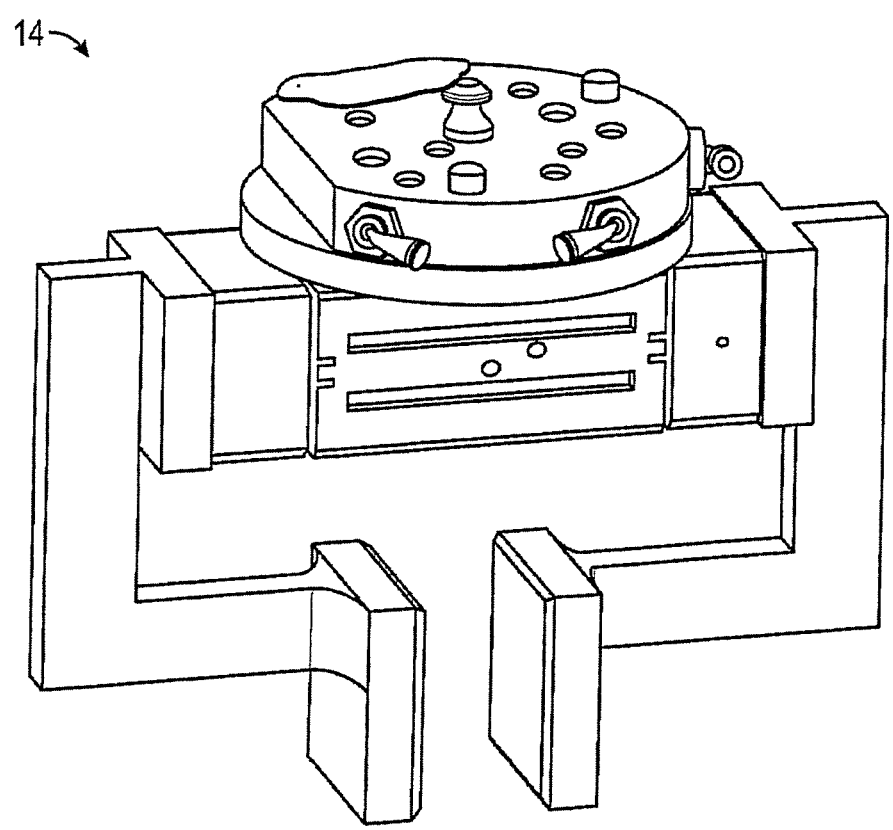
FIG. 38 depicts an embodiment of a preload bar pickup tool.
Figure 39:
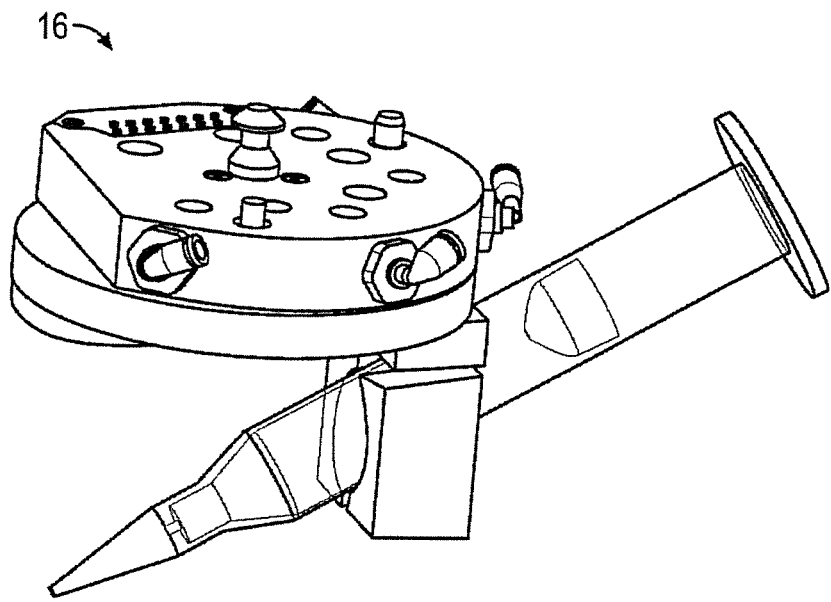
FIG. 39 depicts an embodiment of an adhesive dispenser.
Figure 40:
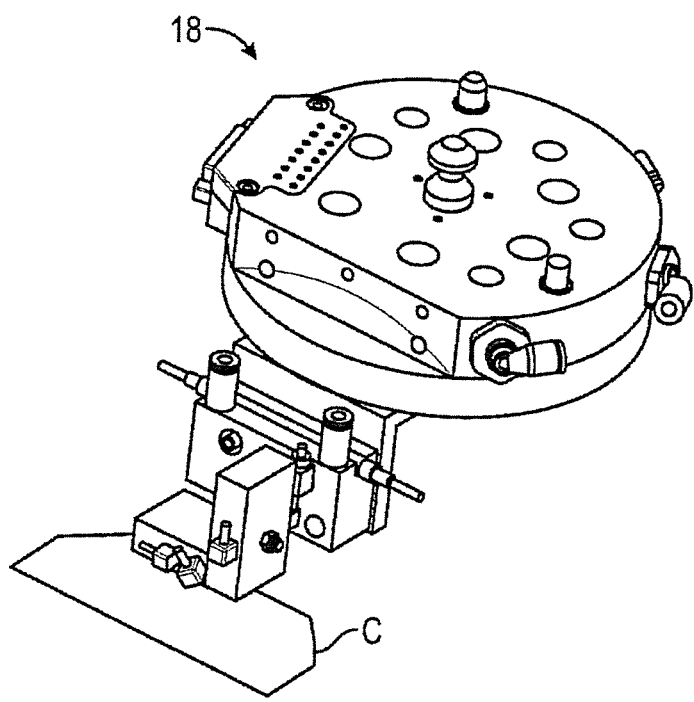
FIG. 40 depicts an embodiment of a cell, interconnect, and diode pick-up tool.
Figure 41:
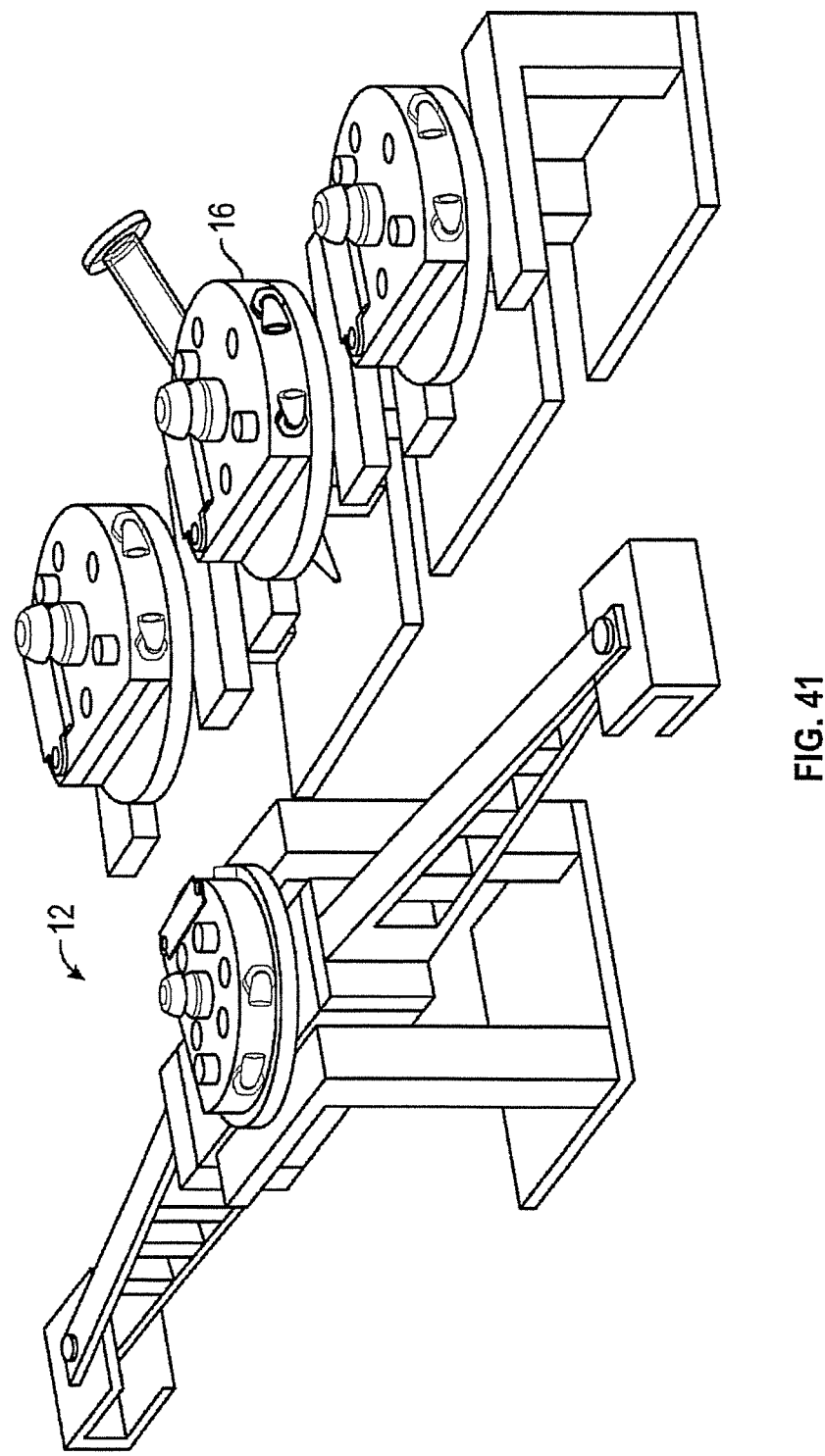
FIG. 41 depicts an embodiment of the tool stand-off brackets for parking of the various tools during operations.

FIG. 36 depicts the various components of SPM assembly tray 400. The SPM assembly tray 400 is utilized to locate and stabilize free cells, interconnects, diodes, busbars and turnarounds during the stringing process. Each of these components is deposited onto SPM assembly tray 400 utilizing robot 120 in conjunction with vacuum assisted pickup mechanism 18. The SPM assembly tray 400 comprises three separate plates, which are shown in the figures below the top portion of FIG. 36. These three components are the linear motor interface plate 402, the vacuum manifold plate 404, and the string assembly plate 406. The linear motor interface plate 402 bolts directly to the X-axis linear motor and is equipped with locating pins for accurate placement of the vacuum manifold plate 404.

The manifold plate 404 is furnished with elbow fittings to enable quick connect/disconnect with the vacuum system. The manifold plate 404 is subdivided into channels to permit staged vacuum application and release. Staggering the vacuum channel application decreases the overall required vacuum system capacity by limiting the number of air ports exposed to the atmosphere at any given time. The manifold plate 404 may also be equipped with locating pins for restraining the stringing tray.

The stringing tray 406 is perforated in specific locations to hold cells, interconnects, diodes, busbars and turnarounds in place. The stringing tray 406 also contains machined locating features for the cells and cover glass to ensure accurate relative placement and repeatability. The stringing tray 406 has pins at the ends of all string columns for positioning of the coverglass preload bars 1000.

During the CICing process it is necessary to hold the coverglass slides stationary with respect to the ICs. In addition to the relative inplane position—governed by machined features in the stringing tray 406—the bond line thickness between the cells and coverglass is equally critical. To achieve accurate bond lines across the entire SPM, a calibrated preload bar 1000 is utilized, which has a low-pressure spring driven, adjustable mechanism. Each preload bar 1000 is positioned by utilizing preload bar pickup 14. The preload bars 1000 are delivered via a gravity feed ramp 1002, which has integrated feed rollers and utilizes actuators, which may be located on either side of the feed ramp. After the preload bars 1000 are utilized during the stringing process, following the complete cell adhesive curing, the preload bars 1000 may be replaced by hand on the gravity feed ramp 1002.

The last automated step in the SPM manufacturing process is the application of the substrate to the backside of the cells. Whether the substrate is bare Kapton, Kapton with pressure sensitive adhesive, or a mylar transfer sheet, the material must be restrained and applied in a controlled manner. This is accomplished with bonding platen 1100 depicted in FIG. 26. The bonding platen 1100 has locating holes for registration on pins embedded in the perimeter of the stringing tray 400.

FIGS. 43-45 are flow charts showing processes for fabricating SPMs utilizing CICs, bare cells, and IMM ICs using embodiments of the work station 10 disclosed herein. FIG. 43 is a flow chart showing a process for manufacture of CICs to SPMs utilizing embodiments of the disclosed system. FIG. 44 is a flow chart showing a process for manufacture of bare cells to SPMs. FIG. 45 is a flow chart showing a process for manufacture of IMM ICs to SPMs.

While the above is a description of various embodiments of the present invention, further modifications may be employed without departing from the spirit and scope of the present invention. Thus the scope of the invention should not be limited according to these factors, but according to the following appended claims.

What is claimed is:

1. A method of manufacturing standard power modules for solar arrays comprises the following steps:
   positioning, via a robotically manipulated effector tool, a diode, an interconnecting electrical conductor and a busbar onto a stringing tray configured to receive a plurality of components for a standard power module in a preconfigured arrangement;
   placing a bare cell into position adjacent to the diode, interconnecting electrical conductor, and the busbar to form a string, the string having a front side and a back side;
   positioning, via a robotically manipulated effector tool, the front side of the string adjacent to a welder;
   welding the front side of the string;
   positioning, via a robotically manipulated effector tool, a cover glass over the string;
   weighting the cover glass; and
   turning the string over and welding the back side.

2. The method of claim 1 further comprising the step of applying a substrate to the back side of the string.

3. The method of claim 2 wherein the substrate comprises Kapton.

* * * * *